(12) United States Patent
Nguyen

(10) Patent No.: US 6,906,571 B1
(45) Date of Patent: *Jun. 14, 2005

(54) COUNTER-BASED PHASED CLOCK GENERATOR CIRCUITS AND METHODS

(75) Inventor: Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/696,226

(22) Filed: Oct. 28, 2003

Related U.S. Application Data

(63) Continuation-in-part of application No. 10/651,811, filed on Aug. 29, 2003, which is a continuation-in-part of application No. 10/618,329, filed on Jul. 11, 2003.

(51) Int. Cl.[7] ................................................ G06F 1/04
(52) U.S. Cl. ...................................... 327/295; 327/116
(58) Field of Search ................................ 327/116, 119, 327/122, 291, 295–299; 377/47–49; 331/53; 708/101, 103

(56) References Cited

U.S. PATENT DOCUMENTS

| | | | |
|---|---|---|---|
| 3,952,253 A | 4/1976 | DeVolpi et al. | 327/160 |
| 4,017,719 A * | 4/1977 | Kaplan et al. | 708/101 |
| 4,290,022 A | 9/1981 | Puckette | 327/241 |
| 5,109,395 A * | 4/1992 | Tanaka | 377/44 |
| 5,744,992 A | 4/1998 | Baumann | 327/241 |
| 5,898,329 A | 4/1999 | Hopkins | 327/176 |
| 6,023,199 A | 2/2000 | Cheung | 332/109 |
| 6,259,283 B1 | 7/2001 | Nguyen | 327/122 |
| 6,285,226 B1 | 9/2001 | Nguyen | 327/175 |
| 6,351,756 B1 * | 2/2002 | Taniyoshi | 708/103 |
| 6,426,660 B1 | 7/2002 | Ho et al. | 327/175 |
| 6,788,120 B1 | 9/2004 | Nguyen | 327/172 |

* cited by examiner

Primary Examiner—Minh Nguyen
(74) Attorney, Agent, or Firm—Lois D. Cartier

(57) ABSTRACT

Phased clock generator circuits and methods that use counters to define the desired positions of the phased output clock edges. A plurality of counters are each clocked by a count clock relatively much faster than the input clock. A first counter counts for one input clock period, and the counted value is stored. The stored value is then divided and added to provide the number of counts in various fractions of the input clock period. The divided and/or added values are provided to a second counter that counts from zero and generates various pulses at desired times throughout the input clock period. The pulses from the second counter are used (sometimes in combination with the input clock signal) to provide phased output clock signals at predetermined times during the input clock cycle. Some embodiments include a duty cycle correction feature. In some embodiments, duty cycle correction is optional.

31 Claims, 15 Drawing Sheets

COUNTER-BASED PHASED CLOCK GENERATOR CIRCUITS AND METHODS

This application is a Continuation-in-Part of Ser. No. 10/651,811, filed Aug. 29, 2003, which is a Continuation-in-Part of Ser. No. 10/618,329, filed Jul. 11, 2003.

FIELD OF THE INVENTION

The invention relates to clock generator circuits providing phased output signals. More particularly, the invention relates to counter-based phased clock generator circuits and methods.

BACKGROUND OF THE INVENTION

Clock signals are used in virtually every integrated circuit (IC) and electronic system to control timing. For example, every time a rising edge occurs on a clock signal, all the flip-flops in a circuit might change signal, the taster the circuit operates. Therefore, where performance is an issue, circuit designers usually prefer to use the fastest available clock that can be supported by the delays on the logic paths through the circuit. In other words, the performance of a circuit is typically limited by the logic delays on the slowest logic path. However, sometimes the longest path delay through the circuit is significantly shorter than the period of the available clock, and the frequency of the available clock becomes the limiting factor.

One way to overcome this limitation is to create from an input clock signal (e.g., a clock signal having an undesirably low clock frequency) a series of phased clock signals that can then be used to clock successive stages of logic. For example, an input clock signal can be used to generate four phased clock signals delayed from the input clock signal by 0, 90, 180, and 270 degrees (i.e., not delayed, delayed by one fourth of an input clock period, delayed by half of an input clock period, and delayed by three fourths of an input clock period, respectively).

Phased clock signals are typically generated using a phase-lock loop (PLL) or delay-lock loop (DLL) circuit. However, PLLs are analog in nature and take a long time to simulate, and a design that works in one manufacturing process may stop working when manufactured using another process. Therefore, PLLs are difficult to design, and often are not feasible in a given circuit or system. DLLs can also be very complicated and difficult to design. Additionally, DLLs typically consume a great deal of silicon area. Hence, creating a set of phased clock signals is often not feasible using known circuits and methods.

Therefore, it is desirable to provide circuits and methods that enable a circuit designer to create a series of phased clock signals from an input clock signal, using a fairly simple circuit that consumes a relatively small amount of silicon area. Preferably, such circuits and methods can optionally be implemented using the logic resources included in a programmable logic device (PLD).

SUMMARY OF THE INVENTION

The invention provides phased clock generator circuits and methods that use counters to define the desired positions of the phased output clock edges. A phased clock generator circuit accepts an input clock signal and provides a series of output clock signals offset from the input clock signal by a predetermined set of delays. A phased clock generator circuit according to an embodiment of the invention includes a plurality of counter circuits, each clocked by a count clock relatively much faster than the input clock signal. In some embodiments, each counter includes a small oscillator circuit implemented in the same fashion and generating a count clock for the counter. Thus, each counter uses a count clock having the same clock frequency.

A first counter is periodically enabled to count for one input clock period, and the counted value is stored in a register. Thus, the stored value represents the number of counts in one input clock period. The stored value is divided by two, providing a first value that represents the number of counts in half of the input clock period. In some embodiments, the number of counts in one input clock period is divided by two prior to storing the first value in the register, while in some embodiments the number is first stored and then divided. The first value is again divided by two (or, in some embodiments, the number of counts in one input clock period is divided by four), providing a second value that represents the number of counts in one fourth of the input clock period. The first and second values are added together in an adder circuit and stored in another register as a third value. Thus, the third value represents three-fourths of the number of counts in an input clock period.

The first, second, and/or third values are provided to counter circuits that count (for example) from zero to the divided values. Thus, each counter circuit generates one or more pulses at predetermined times in the input clock period (e.g., one fourth, one half, or three-fourths of the way through the input clock period). The pulses from the counter circuits are used (in some embodiments, in combination with the input clock signal) to provide phased output clock signals in which transitions occur at predetermined times during the input clock cycle. In some embodiments, the circuit provides phased output clock signals offset from the input clock signal by 0, 90, 180, and 270 degrees.

Some embodiments include a duty cycle correction feature, wherein the duty cycles of the phased output clock signals are independent of the duty cycle of the input clock signal. In some embodiments, the duty cycle correction feature can be enabled or disabled as desired.

Other embodiments of the invention provide related structures and methods of providing phased output clock signals from an input clock signal.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 1:
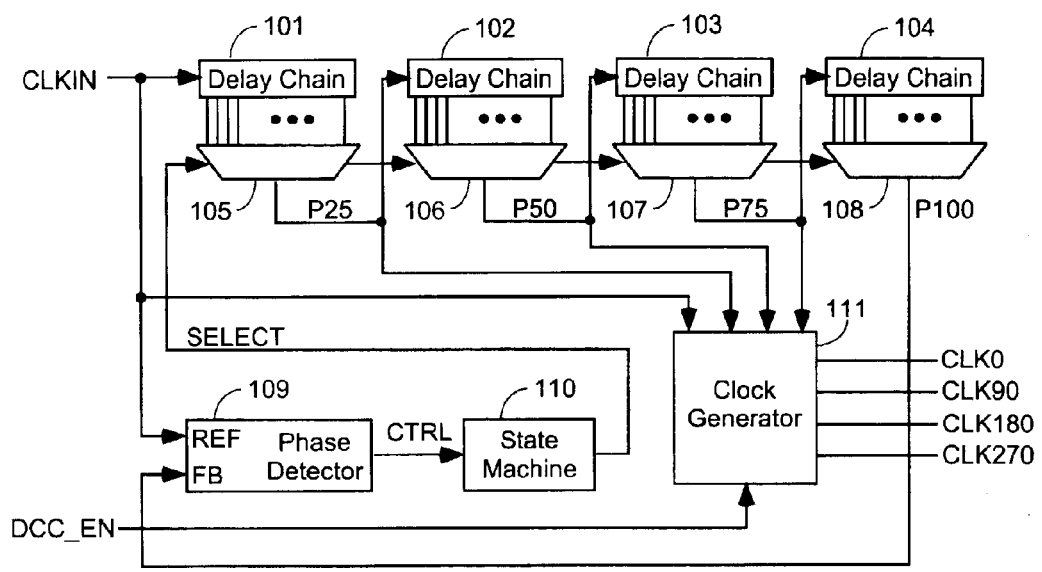
FIG. 1 illustrates a prior art phased clock generator circuit that uses a DLL and optionally provides duty cycle correction (DCC).

FIG. 1 illustrates a known phased clock generator circuit that uses a DLL to generate output clock signals CLK0, CLK90, CLK180, and CLK270. Signals CLK0, CLK90, CLK180, and CLK270 are offset from input clock signal CLKIN by 0, 90, 180, and 270 degrees, respectively.

The phased clock generator circuit of FIG. 1 includes clock generator 111, delay chains 101–104, clock multiplexers 105–108, phase detector 109, and state machine 110. Delay chains 101–104 and multiplexers 105–108 provide signals P25, P50, P75, and P100, respectively, delayed from signal CLKIN by one-quarter, one-half, three-quarters, and one full input clock cycle, respectively. Clock generator 111 is driven by signals P25, P50, and P75 in addition to clock input signal CLKIN, and provides phased output clock signals CLK0, CLK90, CLK180, and CLK270.

Signal P100 is provided to phase detector 109 along with input signal CLKIN, and phase detector 109 provides control signals CTRL (e.g., signals ADD and SUBTRACT, not shown) indicating a phase relationship between signals CLKIN and P100. State machine 110 receives control signals CTRL and provides SELECT signals that control clock multiplexers 105–108 to select appropriate clock signals P25, P50, P75, and P100. Thus, the DLL ensures the correct phase relationship between each signal P25, P50, P75, and P100 and input clock signal CLKIN, and the phased clock generator circuit is accurate over a range of input clock frequencies. Clock generator 111 uses the signals CLKIN, P25, P50, and P75, which accurately reflect the starting point, one-quarter, one-half, and three-quarter points of the input clock cycle, to generate phased output clock signals CLK0, CLK90, CLK180, and CLK270.

In the pictured embodiment, signal DCC_EN is a duty cycle correction select signal provided to clock generator 111. The status of signal DCC_EN determines whether or not the phased output clock signals are duty cycle corrected, e.g., to have 50 percent duty cycles.

A significant disadvantage of the circuit of FIG. 1 is that implementing a DLL typically requires a large amount of circuitry. The circuit can be reduced in size by using a PLL. However, PLLs are very process-dependent, as described in the background section above, and digital solutions are often preferred.

Figure 2:
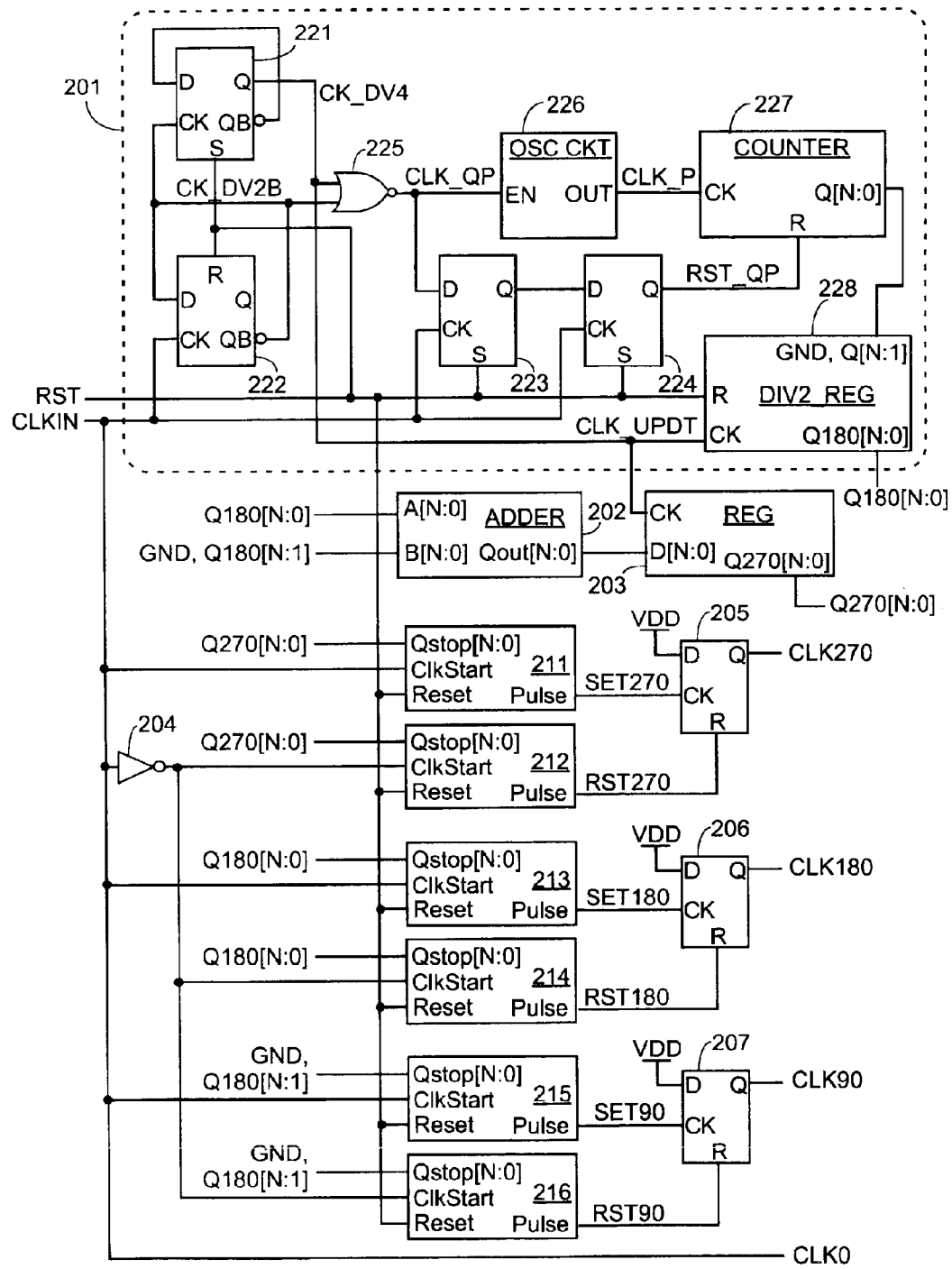
FIG. 2 is a schematic diagram of a phased clock generator circuit according to an embodiment of the invention that does not provide DCC and includes seven counters.

FIG. 2 illustrates a phased clock generator circuit providing similar functionality to the circuit of FIG. 1, but requiring less circuitry and supporting a wider range of operating clock frequencies for the input clock signal. The circuit of FIG. 2 is small enough, for example, to be a practical addition to user circuits implemented in programmable logic devices (PLDs) such as field programmable gate arrays (FPGAS) and complex programmable logic devices (CPLDs). Note that the phased clock generator circuit of FIG. 2 does not provide DCC. Instead, the pulse widths of the phased output clock signals are the same as the pulse width of the input clock signal CLKIN.

The circuit of FIG. 2 includes a first counter circuit 201, a second counter circuit comprising counters 215–216 (Counters 2–3, respectively), a third counter circuit comprising counters 213–214 (Counters 4–5, respectively), a fourth counter circuit comprising counters 211–212 (Counters 6–7, respectively), an adder 202, a divide-by-two register 203, an inverter 204, and an output clock generator comprising flip-flops 205–207.

Figure 3:
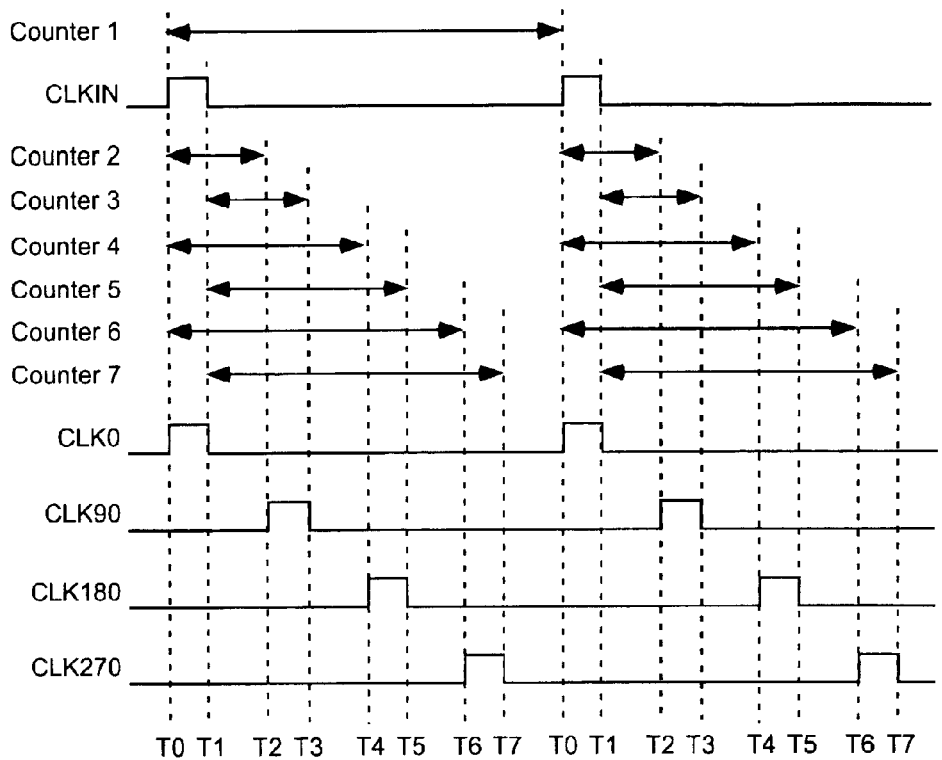
FIG. 3 is a timing diagram for the phased clock generator circuit of FIG. 2.

The circuit of FIG. 2 operates as shown in FIG. 3. Thus, the combination of FIGS. 2 and 3 should be consulted in conjunction with the following explanation of the circuit of FIG. 2.

The first counter circuit (Counter 1, or 201) uses a relatively faster clock signal (e.g., generated by an oscillator circuit 226) to count a number of counts P in one period of input clock signal CLKIN. The number of counts P is divided by two and the resulting value Q180[N:0] is stored in register 228. In the embodiment of FIG. 2, the division by two is accomplished by storing only the N most significant bits from counter 227 in register 228. N is an integer; in some embodiments, N is eight. In other embodiments, N has a value other than eight.

The value stored in divide-by-two register 228 is added to one-half of the same value (i.e., value Q180[N:0] is added to value GND, Q180[N:1]) in adder 202. Any appropriate adder design can be used to implement adder 202, e.g., a ripple adder or a bypass adder. The resulting sum Q270[N:0] is stored in register 203. Value Q270[N:0] represents the number of counts in three-fourths of one input clock cycle, or 3P/4.

When signal CLKIN goes high at time T0, signal CLK0 (which is the same as signal CLKIN) goes high as well. Additionally, Counter 1 begins to count a number of counts P in the period of input clock signal CLKIN. The counting process is repeated, in the pictured embodiment, during every fourth input clock cycle. The time unit used in determining the number of counts in an input clock period is the period of a relatively faster clock signal CLK_P provided by an oscillator circuit 226. Counters 2–7 (215–216, 213–214, and 211–212, respectively) are clocked by similar faster clock signals (e.g., generated by oscillator circuits having the same design and configuration as oscillator circuit 226).

When signal CLKIN goes low again, at time T1 in FIG. 3, signal CLK0 of course goes low as well.

The second counter circuit includes Counters 2 and 3 (215 and 216, respectively). Counter 2 (215) starts counting when input clock signal CLKIN (ClkStart) goes high, and compares the count value with one-half of the value stored in divide-by-two register 228 (i.e., P/4). Note that Counter 2 does not use the least significant bit from register 228, thus dividing the value in register 228 by two to provide the counter stop value Qstop[N:0]. When the value in Counter 2 reaches P/4 (at time T2 of FIG. 3), Counter 2 (215) provides a high output pulse on signal SET90. The high output pulse clocks a high value into flip-flop 207, driving signal CLK90 high at time T2, as shown in FIG. 3. The high output pulse also resets Counter 2.

Counter 3 (216) starts counting when input clock signal CLKIN (ClkStart) goes low at time T1, and compares the count value with one-half of the value stored in divide-by-two register 228 (i.e., P/4). As with Counter 2, Counter 3 does not use the least significant bit from register 228, thus dividing the value in register 228 by two to provide the counter stop value Qstop[N:0]. When the value in Counter 3 reaches P/4 (at time T3 of FIG. 3), Counter 3 (216) provides a high output pulse on signal RST90. The high output pulse resets flip-flop 207, driving signal CLK90 low at time T3, as shown in FIG. 3. The high output pulse also resets Counter 3.

The third counter circuit includes Counters 4 and 5 (213 and 214, respectively). Counter 4 (213) starts counting when input clock signal CLKIN (ClkStart) goes high, and compares the count value with the value stored in divide-by-two register 228 (i.e., P/2). When the value in Counter 4 reaches P/2 (at time T4 of FIG. 3), Counter 4 (213) provides a high output pulse on signal SET180. The high output pulse clocks a high value into flip-flop 206, driving signal CLK180 high at time T4, as shown in FIG. 3. The high output pulse also resets Counter 4.

Counter 5 (214) starts counting when input clock signal CLKIN (ClkStart) goes low at time T1, and compares the count value with the value stored in divide-by-two register 228 (i.e., P/2). When the value in Counter 5 reaches P/2 (at time T5 of FIG. 3), Counter 5 (214) provides a high output pulse on signal RST180. The high output pulse resets flip-flop 206, driving signal CLK180 low at time T5, as shown in FIG. 3. The high output pulse also resets Counter 5.

The fourth counter circuit includes Counters 6 and 7 (211 and 212, respectively). Counter 6 (211) starts counting when input clock signal CLKIN (ClkStart) goes high, and compares the count value with the value Q270[N:0] stored in three-quarter register 203 (i.e., 3P/4). When the value in Counter 6 reaches 3P/4 (at time T6 of FIG. 3), Counter 6 (211) provides a high output pulse on signal SET270. The high output pulse clocks a high value into flip-flop 205, driving signal CLK270 high at time T6, as shown in FIG. 3. The high output pulse also resets Counter 6.

Counter 7 (212) starts counting when input clock signal CLKIN (ClkStart) goes low at time T1, and compares the count value with the value stored in three-quarter register 203 (i.e., 3P/4). When the value in Counter 7 reaches 3P/4 (at time T7 of FIG. 3), Counter 7 (212) provides a high output pulse on signal RST270. The high output pulse resets flip-flop 205, driving signal CLK270 low at time T7, as shown in FIG. 3. The high output pulse also resets Counter 7.

In the pictured embodiment, counter 1 (201) is designed to recount the length of the input clock pulse (i.e., to generate a new value of P) every fourth clock cycle. In other embodiments, the periodicity of the count has other values, e.g., the desired periodicity can be selected based on the stability of the input clock frequency. In other embodiments, other implementations of counter circuit 201 are used. Any appropriate embodiment can be used.

Counter circuit 201 has as inputs input clock signal CLKIN and reset signal RST. Counter circuit 201 provides a clock update signal CLK_UPDT and a counter output bus Q180[N:0] providing a value representing half the number of counts in an input clock period (P/2). In the pictured embodiment, counter circuit 201 includes a counter 227, which counts a number of counts in one period of the input clock signal CLKIN, and divide-by-two register 228, which stores half the number of counts counted by counter 227. In addition, counter circuit 201 includes set flip-flops 221 and 223–224, reset flip-flop 222, NOR gate 225, and oscillator circuit 226.

Flip-flops 221–222 together implement a clock divider that provides from input clock signal CLKIN a divided-by-four clock signal CK_DV4, which is also signal CLK_UPDT. Thus, signal CLK_UPDT is a clock signal having four times the period of signal CLKIN.

Initially, signal CLK_QP is low, because signals CK_DV4 and CK_DV2B are high. (Signals CK_DV4 and CK_DV2B are high because flip-flop 221 is a set flip-flop and flip-flop 222 is a reset flip-flop.) After signal RST is deasserted, on the next (first) rising edge of signal CLKIN, signal CLK_DV2B goes low. Signal CLK_DV4 goes low on the second rising edge of signal CLKIN, but signal CLK_DV2B goes high again at the same time. Therefore, it is not until the third rising edge of signal CLKIN that signal CLK_QP provides a high value on oscillator enable signal EN to oscillator circuit 226. From this point on, signal CLK_QP provides a high value for one input clock period out of every four.

When enabled by signal CLK_QP, oscillator circuit 226 generates a relatively fast oscillator output signal OUT (i.e., faster than input clock signal CLKIN). The oscillator output signal CLK_P is used by counter 227 to measure the input clock period. Thus, in the pictured embodiment counter 227 performs the counting process only during one input clock period out of each four input clock periods. A rising edge on signal CLK_DV4 both terminates the counting process and (as signal CLK_UPDT) clocks the counted value into register 228. Two clock cycles later, signal RST_QP also goes high, resetting counter 227 and readying the counter for the next count. The cycle then repeats each four clock cycles.

Figure 9:
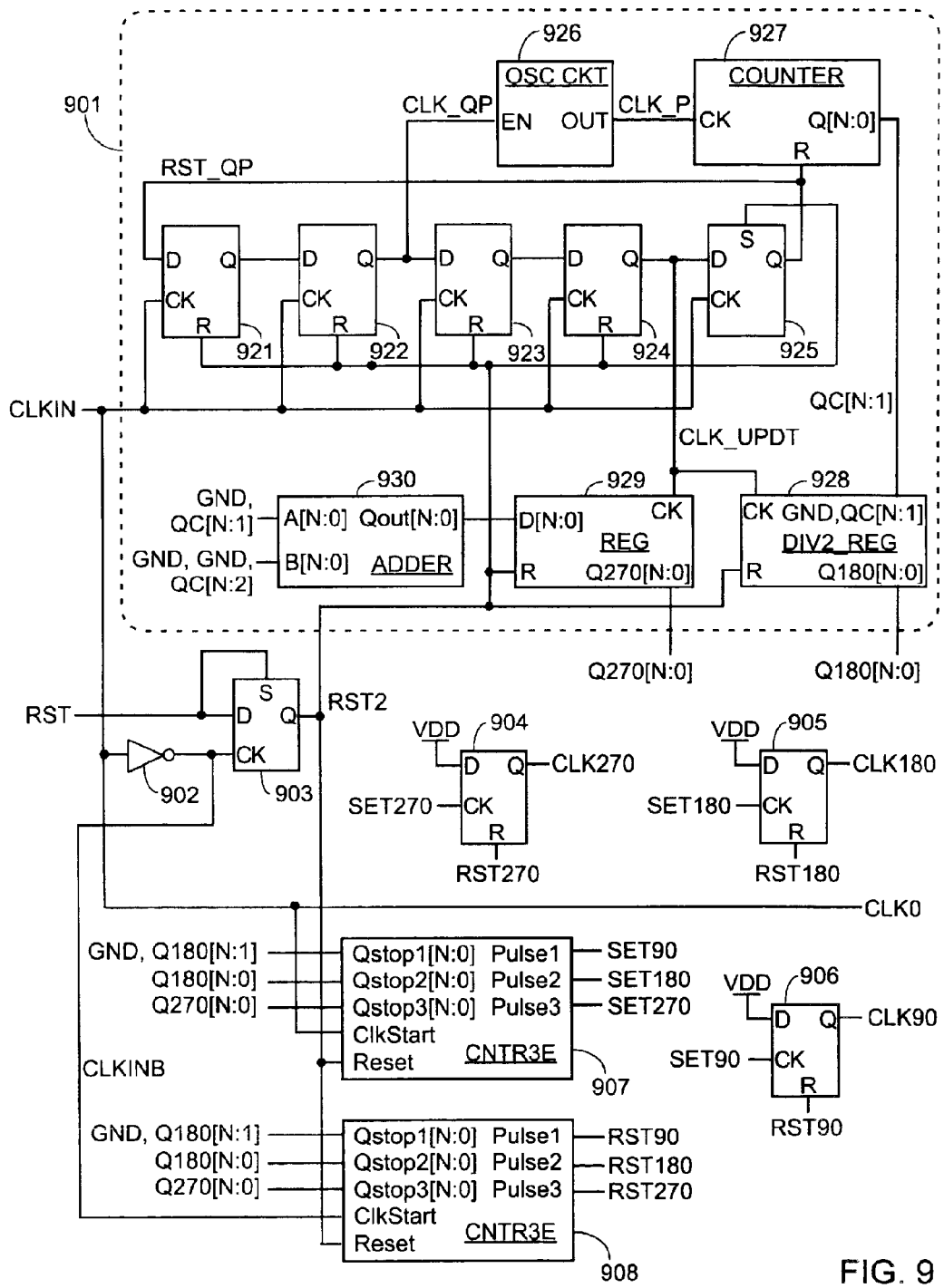
FIG. 9 is a schematic diagram of a phased clock generator circuit according to an embodiment of the invention that does not provide DCC and includes three counters.

Note that the divide-by-four clock divider comprising flip-flops 221–222 determines the frequency with which the length of the input clock period is determined. For example, in the embodiment of FIG. 2, the period is measured every four clock cycles. By using a clock divider having a divisor other than four, the input clock period can be measured with a different frequency than every four clock cycles, e.g., every eight clock cycles when a divide-by-eight clock divider is used. Other circuits can also be used that alter the frequency with which the input clock period is measured. For example, FIG. 9 shows an embodiment in which the input clock period is measured every five clock cycles. It will be clear to one of skill in the relevant arts that this selection is a matter of design choice.

Figure 4:
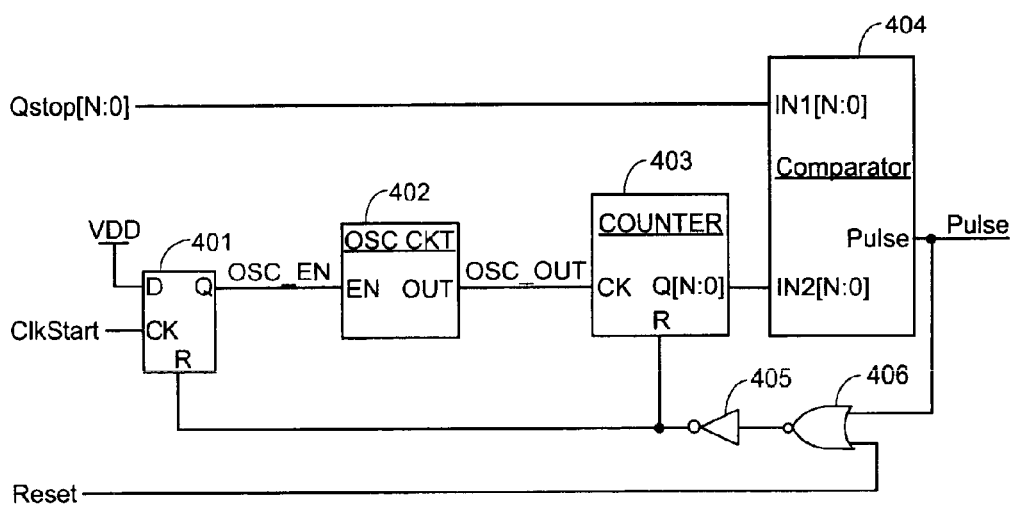
FIG. 4 is a schematic diagram of a counter that can optionally be used to implement six of the counters in the embodiment of FIG. 2.

FIG. 4 is a schematic diagram of one counter embodiment that can be used to implement counters 211–216 of FIG. 2.

This embodiment can be used, for example, when counter 201 is implemented as shown in FIG. 2. The counter of FIG. 4 includes a reset flip-flop 401, an oscillator circuit 402, a counter 403, a comparator 404, a NOR gate 406, and an inverter 405. When signal ClkStart goes high, the power high VDD value is clocked into flip-flop 401, driving flip-flop output signal OSC_EN high and enabling oscillator 402. Oscillator 402 provides an output signal OSC_OUT having a frequency relatively much higher than that of input clock signal CLKIN. Counter 403 is clocked by oscillator 402, and thus counts the oscillations on signal OSC_OUT. The value stored in counter 403 is passed to comparator 404, where it is compared to the value Qstop[N:0]. When the values match, signal PULSE goes high, resetting flip-flop 401 and counter 403 via NOR gate 406 and inverter 405. Signal Reset can also reset flip-flop 401 and counter 403 via NOR gate 406 and inverter 405.

Any known oscillator circuit can be used to implement oscillator circuit 402 of FIG. 4 and oscillator circuit 226 of FIG. 2. Preferably, the same implementation is used for all seven oscillator circuits in the phased clock generator circuit, as this approach creates a high correlation between the seven oscillators irregardless of external factors such as processing and temperature variations. For example, the well known ring oscillator design (e.g., a loop including an odd number of logic gates, e.g., two inverters and a NAND gate driven by the enable signal) can be used. This embodiment is particularly useful when the clock doubler circuit is implemented in a PLD, because the oscillator can be implemented using the programmable logic blocks of the PLD. In some embodiments, external oscillators are used.

Any known counter or counters can be used to implement counter 403 of FIG. 4 and/or counter 227 of FIG. 2. For example, the well known ripple counters can be used. In some embodiments, double-edge flip-flops are used to double the count stored in the counter. In some embodiments, a first subset of the counters use double-edge flip-flops with a first oscillator frequency, while a second subset of the counters use single-edge flip-flops with a second oscillator frequency twice that of the first oscillator frequency.

Any known comparator can be used to implement comparator 404 of FIG. 4. For example, the well known exclusive-NOR (XNOR) implementation can be used, wherein each pair of bits is provided to an XNOR gate, the XNOR gates are combined using NAND gates, and the NAND gates each drive a NOR gate providing the Pulse output signal in FIG. 4.

Figure 5:
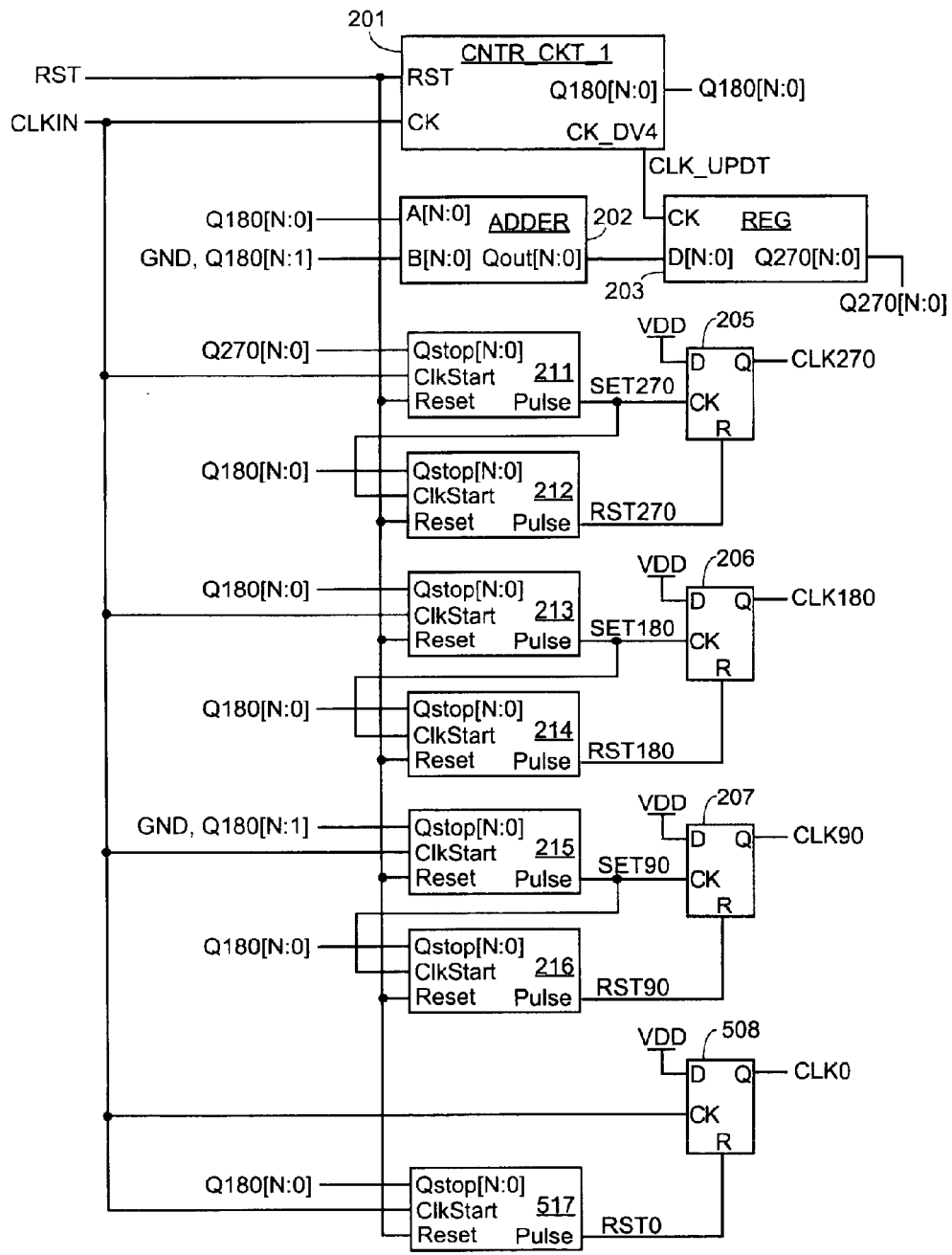
FIG. 5 is a schematic diagram of a phased clock generator circuit according to an embodiment of the invention that provides DCC and includes eight counters.

FIG. 5 is a schematic diagram of a phased clock generator circuit according to another embodiment of the invention. This embodiment includes eight counters rather than the seven counters used in the embodiment of FIG. 2. However, the embodiment of FIG. 5 provides phased clock output signals having a 50 percent duty cycle.

The circuit of FIG. 5 includes a first counter circuit 201, an adder 202, a divide-by-two register 203, a second counter circuit comprising counters 215–216 (Counters 2–3, respectively), a third counter circuit comprising counters 213–214 (Counters 4–5, respectively), a fourth counter circuit comprising counters 211–212 (Counters 6–7, respectively), a fifth counter circuit comprising counter 517 (Counter 8), and an output clock generator comprising flip-flops 205–207 and 508.

The embodiment of FIG. 5 is similar in some respects to that of FIG. 2. For example, Counter 1 (CNTR_CKT_1) can be implemented in the same fashion as counter circuit 201 of FIG. 2, and counters 211–216 and 517 can be implemented in the same fashion as the circuit shown in FIG. 4. One difference between the two circuits is that in FIG. 5 Counters 3, 5, and 7 (212, 214, and 216) are provided with different start and stop values, altering the positions of the falling clock edges on the output signals. Another difference is that in the embodiment of FIG. 5, output signal CLK0 is provided by a flip-flop 508 controlled by an eighth counter (Counter 8, 517). These differences provide the DCC capability for output signal CLK0.

Figure 6:
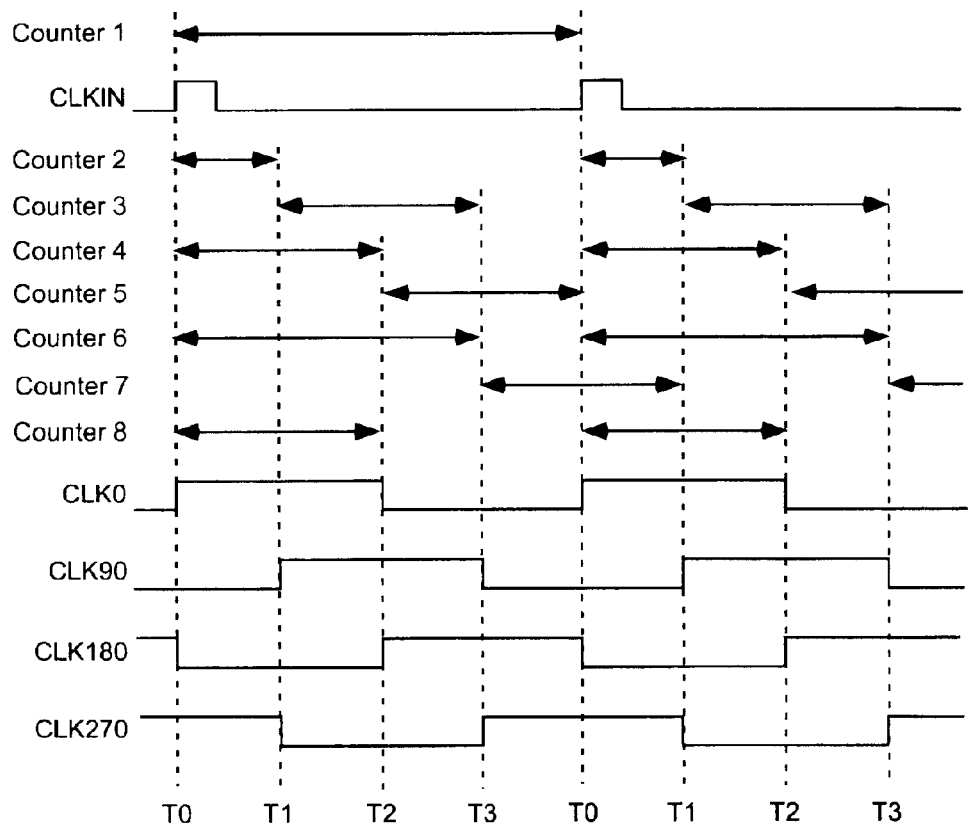
FIG. 6 is a timing diagram for the phased clock generator circuit of FIG. 5.

The circuit of FIG. 5 operates as shown in FIG. 6. Thus, the combination of FIGS. 5 and 6 should be consulted in conjunction with the following explanation of the circuit of FIG. 5.

When signal CLKIN goes high at time T0, the high value clocks a high value into flip-flop 508, driving signal CLK0 high, as shown in FIG. 6. Additionally, Counter 1 (201) begins to count a number of counts P in the period of input clock signal CLKIN.

The second counter circuit includes Counters 2 and 3 (215 and 216, respectively). Counter 2 (215) starts counting when input clock signal CLKIN (ClkStart) goes high, and compares the count value with one-half of the value Q180[N:0] (i.e., P/4). When the value in Counter 2 reaches P/4 (at time T1 of FIG. 6), Counter 2 (215) provides a high output pulse on signal SET90. The high output pulse clocks a high value into flip-flop 207, driving signal CLK90 high at time T1, as shown in FIG. 6. The high output pulse also resets Counter 2.

Counter 3 (216) starts counting when signal SET90 goes high at time T1, and compares the count value with the value Q180[N:0](i.e., P/2). When the value in Counter 3 reaches P/2 (at time T3 of FIG. 6), Counter 3 (216) provides a high output pulse on signal RST90. The high output pulse resets flip-flop 207, driving signal CLK90 low at time T3, as shown in FIG. 6. The high output pulse also resets Counter 3.

The third counter circuit includes Counters 4 and 5 (213 and 214, respectively). Counter 4 (213) starts counting when input clock signal CLKIN (ClkStart) goes high, and compares the count value with the value Q180[N:0] (i.e., P/2). When the value in Counter 4 reaches P/2 (at time T2 of FIG. 6), Counter 4 (213) provides a high output pulse on signal SET180. The high output pulse clocks a high value into flip-flop 206, driving signal CLK180 high at time T2, as shown in FIG. 3. The high output pulse also resets Counter 4.

Counter 5 (214) starts counting when signal SET180 goes high at time T2, and compares the count value with the value Q180[N:0] (i.e., P/2). When the value in Counter 5 reaches P/2 (at the second occurrence of time T0 in FIG. 6), Counter 5 (214) provides a high output pulse on signal RST180. The high output pulse resets flip-flop 206, driving signal CLK180 low at the second occurrence of time T0, as shown in FIG. 6. The high output pulse also resets Counter 5.

The fourth counter circuit includes Counters 6 and 7 (211 and 212, respectively). Counter 6 (211) starts counting when input clock signal CLKIN (ClkStart) goes high, and compares the count value with the value Q270[N:0] stored in three-quarter register 203 (i.e., 3P/4). When the value in Counter 6 reaches 3P/4 (at time T3 of FIG. 3), Counter 6 (211) provides a high output pulse on signal SET270. The high output pulse clocks a high value into flip-flop 205, driving signal CLK270 high at time T3, as shown in FIG. 6. The high output pulse also resets Counter 6.

Counter 7 (212) starts counting when signal SET270 goes high at time T3, and compares the count value with the value Q180[N:0] (i.e., P/2). When the value in Counter 7 reaches P/2 (at the second occurrence of time T1 in FIG. 6), Counter 7 (212) provides a high output pulse on signal RST270. The high output pulse resets flip-flop 205, driving signal CLK270 low at the second occurrence of time T1, as shown in FIG. 6. The high output pulse also resets Counter 7.

The fifth counter circuit includes Counter 8 (517). As previously described, at time T0 the rising edge on input clock signal CLKIN clocks a high value into flip-flop 508, causing signal CLK0 to go high at time T0.

Counter 8 (517) starts counting when signal CLKIN goes high at time T0, and compares the count value with the value Q180[N:0] (i.e., P/2). When the value in Counter 8 reaches P/2 (at time T2 in FIG. 6), Counter 8 (517) provides a high output pulse on signal RST0. The high output pulse resets flip-flop 508, driving signal CLK0 low at time T2, as shown in FIG. 6. The high output pulse also resets Counter 8.

As can be seen, for example, in the timing diagram of FIG. 6, some of the counters in the embodiment of FIG. 5 are performing duplicate functions. For example, time T1 is indicated by both of Counters 2 and 7; time T2 is indicated by both of Counters 4 and 8; and time T3 is indicated by both of Counters 3 and 6. In other embodiments, fewer counters are used.

Figure 7:
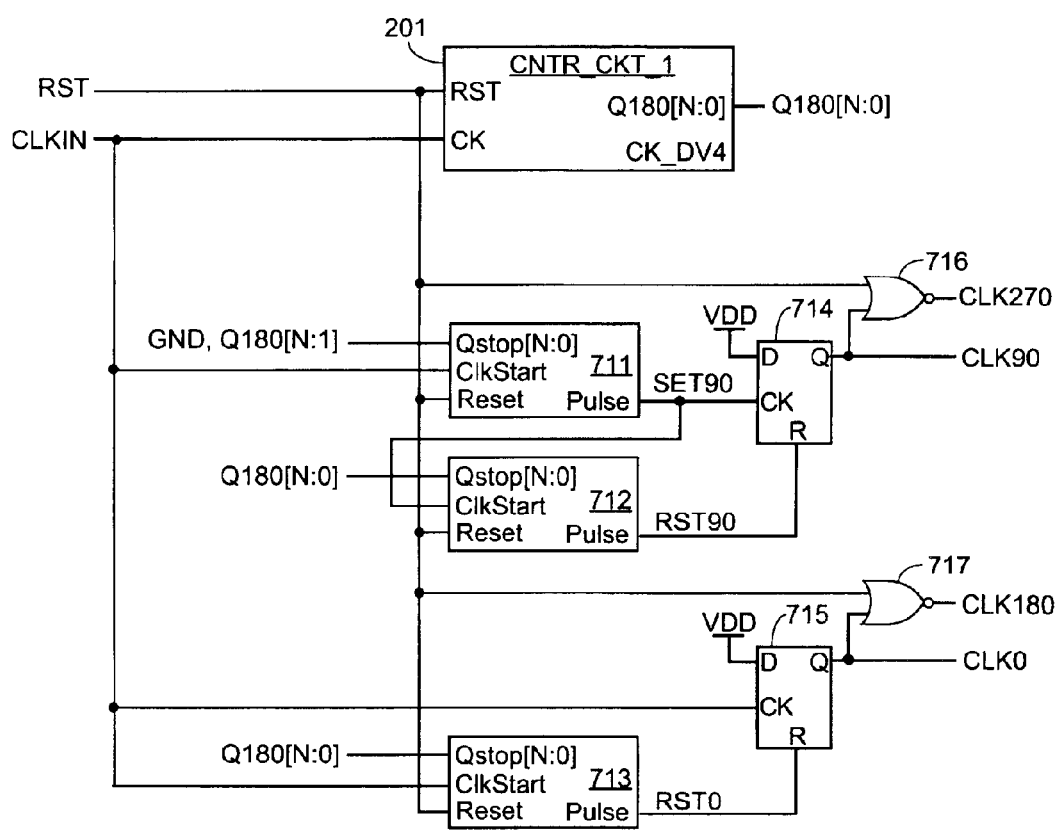
FIG. 7 is a schematic diagram of a phased clock generator circuit according to an embodiment of the invention that provides DCC and includes four counters.

FIG. 7 is a schematic diagram of a phased clock generator circuit according to another embodiment of the invention. The phased clock generator circuit of FIG. 7 provides DCC and includes only four counters.

The circuit of FIG. 7 includes a first counter circuit 201, a second counter circuit comprising counters 711–712 (Counters 2–3, respectively), a third counter circuit comprising counter 713 (Counter 4), and an output clock generator comprising flip-flops 714–715 and NOR gates 716–717. Counter 1 (CNTR_CKT_1) can be implemented, for example, in the same fashion as counter 201 of FIG. 2, and counters 711–713 can be implemented, for example, in the same fashion as the circuit of FIG. 4.

Figure 8:
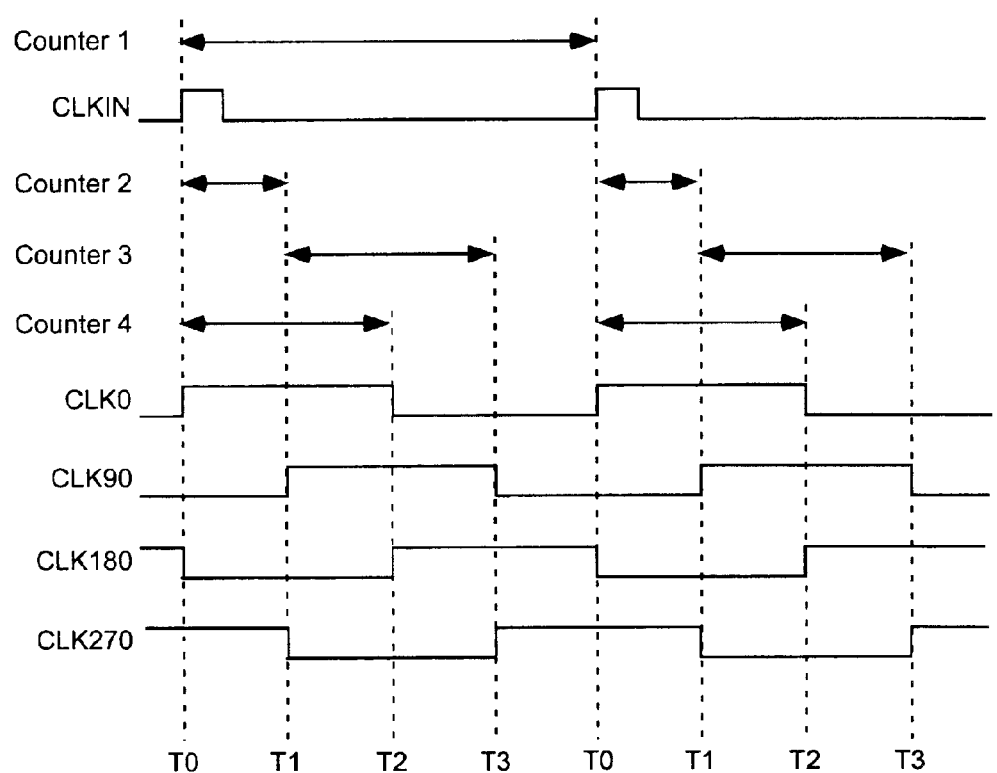
FIG. 8 is a timing diagram for the phased clock generator circuit of FIG. 7.

The circuit of FIG. 7 operates as shown in FIG. 8. Thus, the combination of FIGS. 7 and 8 should be consulted in conjunction with the following explanation of the circuit of FIG. 7.

When signal CLKIN goes high at time T0, the high pulse clocks a high value into flip-flop 715, driving signal CLK0 high, as shown in FIG. 8. When signal CLK0 goes high, signal CLK180 is driven low by NOR gate 717. Additionally, at time T0 Counter 1 (201) begins to count a number of counts P in the period of input clock signal CLKIN.

The second counter circuit includes Counters 2 and 3 (711 and 712, respectively). Counter 2 (711) starts counting when input clock signal CLKIN (ClkStart) goes high, and compares the count value with one-half of the value Q180[N:0] (i.e., P/4). When the value in Counter 2 reaches P/4 (at time T1 of FIG. 8), Counter 2 (711) provides a high output pulse on signal SET90. The high output pulse clocks a high value into flip-flop 714, driving signal CLK90 high at time T1, as shown in FIG. 6. When signal CLK90 goes high, signal CLK270 is driven low by NOR gate 716. The high output pulse on signal SET90 also resets Counter 2.

Counter 3 (712) starts counting when signal SET90 goes high at time T1, and compares the count value with the value Q180[N:0] (i.e., P/2). When the value in Counter 3 reaches P/2 (at time T3 of FIG. 8), Counter 3 (712) provides a high output pulse on signal RST90. The high output pulse resets flip-flop 714, driving signal CLK90 low at time T3, as shown in FIG. 8. When signal CLK90 goes low, signal CLK270 is driven high by NOR gate 716, assuming that reset signal RST is low. The high output pulse on signal RST90 also resets Counter 3.

The third counter circuit includes Counter 4 (713). As previously described, at time T0 the rising edge on input clock signal CLKIN clocks a high value into flip-flop 715, causing signal CLK0 to go high and signal CLK180 to go low at time T0.

Counter 4 (713) starts counting when signal CLKIN goes high at time T0, and compares the count value with the value Q180[N:0] (i.e., P/2). When the value in Counter 4 reaches P/2 (at time T2 in FIG. 8), Counter 4 (713) provides a high output pulse on signal RST0. The high output pulse resets flip-flop 715, driving signal CLK0 low at time T2, as shown in FIG. 8. When signal CLK0 goes low, signal CLK180 is driven high by NOR gate 717, assuming that reset signal RST is low. The high output pulse on signal RST0 also resets Counter 4.

FIG. 9 illustrates another embodiment of the invention, in which the input clock period is measured every fifth clock cycle rather than every fourth cycle as in the embodiments of FIGS. 2, 5, and 7. The embodiment of FIG. 9 includes only three counters, and does not provide DCC.

Figure 10:
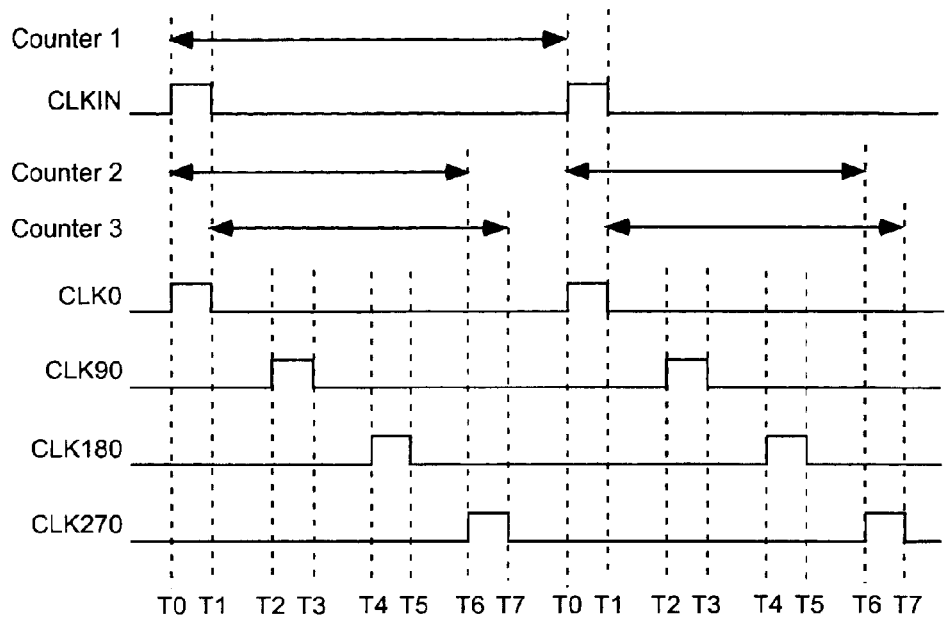
FIG. 10 is a timing diagram for the phased clock generator circuit of FIG. 9.

The phased clock generator circuit of FIG. 9 includes three counter circuits 901 and 907–908, a reset circuit (flip-flop 903 and inverter 902), and an output clock generator (flip-flops 904–906). The circuit of FIG. 9 operates as shown in FIG. 10. Thus, the combination of FIGS. 9 and 10 should be consulted in conjunction with the following explanation of the circuit of FIG. 9.

Counter 1 (901) uses a relatively faster clock signal (e.g., generated by an oscillator circuit 926) to count a number of counts P in one period of input clock signal CLKIN. The number of counts P (QC[N:1]) is divided by two and stored in divide-by-two register 928 as signals Q180[N:0]. The number of counts P is also divided by two (by shifting the bits by one and dropping the least significant bit) and divided by four (by shifting the bits by two and dropping the two least significant bits). The two resulting values are added together in adder 930, and the resulting value (which represents 3P/4) is stored in three-quarter register 929 as signals Q270[N:0]. N is an integer; in some embodiments, N is eight. In other embodiments, N has a value other than eight.

When signal CLKIN goes high at time T0, signal CLK0 (which is the same as signal CLKIN) goes high as well. Additionally, Counter 1 begins to count a number of counts P in the period of input clock signal CLKIN. The counting process is repeated, in the pictured embodiment, during every fifth input clock cycle. The time unit used in determining the number of counts in an input clock period is the period of a relatively faster clock signal CLK_P provided by an oscillator circuit 926. At time T1, signal CLKIN goes low again, and signal CLK0 of course goes low also.

Counters 2 and 3 (907 and 908, respectively) are clocked by similar faster clock signals (e.g., generated by oscillator circuits having the same design and configuration as oscillator circuit 926). Each of Counters 2 and 3 generates three output pulses having individually controlled edge positions, as indicated by the label "CNTR3E".

Counter 2 (907) starts counting when input clock signal CLKIN (ClkStart) goes high, and compares the count value with three different stop values. In a first comparator, the count value is compared with one-half of the value stored in divide-by-two register 928 (i.e., P/4). Note that in making this comparison Counter 2 does not use the least significant bit from register 928, thus dividing the original count value (P) by four to provide the first counter stop value Qstop1[N:0]. When the value in Counter 2 reaches P/4 (at time T2 of FIG. 10), counter 2 (907) provides a high output pulse on signal SET90. The high pulse on signal SET90 clocks a high value into flip-flop 906, driving signal CLK90 high at time T2, as shown in FIG. 10.

Counter 3 performs a similar counting and comparison process, but begins the counting and comparison in response to a second (e.g., falling) edge of input clock signal CLKIN. Thus, one fourth of an input clock period after the first falling edge of input clock signal CLKIN, Counter 3 (908) provides a pulse on signal RST90. The high pulse on signal RST90 resets flip-flop 906, placing a low value on output signal CLK90 at time T3.

Counter 2 continues to count, and a second comparator compares the count value with the value stored in divide-by-two register 928 (i.e., P/2). Note that in making this comparison Counter 2 uses all of the bits from register 928, thus dividing the original count value (P) by two to provide the second counter stop value Qstop2[N:0]. When the value in Counter 2 reaches P/2 (at time T4 of FIG. 10), Counter 2 (907) provides a high output pulse on signal SET180. The high pulse on signal SET180 clocks a high value into flip-flop 905, driving signal CLK180 high at time T4, as shown in FIG. 10.

Meanwhile, Counter 3 continues to perform a similar counting and comparison process. Thus, one half clock period after the first falling edge of input clock signal CLKIN, Counter 3 (908) provides a pulse on signal RST180. The high pulse on signal RST180 resets flip-flop 905, placing a low value on output signal CLK180 at time T5.

Counter 2 continues to count, and a third comparator compares the count value with the value stored in three-quarter register 929 (i.e., 3P/4). Note that in making this comparison Counter 2 uses all of the bits from register 929 to provide stop value Qstop3[N:0]. When the value in Counter 2 reaches 3P/4 (at time T6 of FIG. 10), Counter 2 (907) provides a high output pulse on signal SET270. The high pulse on signal SET270 clocks a high value into flip-flop 904, driving signal CLK270 high at time T6, as shown in FIG. 10. The pulse on signal SET270 also resets counter 2.

Meanwhile, Counter 3 continues to perform a similar counting and comparison process. Thus, three-quarters of one input clock period after the first falling edge of input clock signal CLKIN, Counter 3 (908) provides a high output pulse on signal RST270. The high pulse on signal RST270 resets flip-flop 904, placing a low value on output signal CLK270 at time T7. The pulse on signal RST270 also resets Counter 3.

In the pictured embodiment, the reset signal for each of Counters 1–3 (901 and 907–908) is signal RST2, which is provided by flip-flop 903. Whenever a global reset signal RST is high (active), flip-flop 903 ensures that signal RST2 is also high. Whenever the global reset signal RST is low (inactive), flip-flop 903 clocks in the low value and drives signal RST2 low on the next falling edge of signal CLKIN.

In the pictured embodiment, Counter 1 (901) is designed to recount the length of the input clock pulse (i.e., to generate a new value of P) every fifth clock cycle. In other embodiments, the periodicity of the count has other values, e.g., the desired periodicity can be selected based on the stability of the input clock frequency. In other embodiments, other implementations of counter circuit 901 are used. Any appropriate embodiment can be used.

Counter circuit 901 has as inputs input clock signal CLKIN and reset signal RST2. In the pictured embodiment, counter circuit 901 includes a counter 927, which counts a number of counts P in one period of the input clock signal CLKIN, a divide-by-two register 928 storing the value P/2, an adder 930 adding the values P/2 and P/4, and a three-quarter register 929 storing the value 3P/4. In addition to these elements, counter circuit 901 includes reset flip-flops 921–924, set flip-flop 925, and an oscillator circuit 926.

Flip-flops 921–925 are coupled in series, and serve to provide three non-overlapping clock pulses in the following repeating sequence: RST_QP, CLK_QP, and CLK_UPDT. Each of these signals is high for only one clock cycle.

Initially, signal RST_QP is high, because flip-flop 925 is a set flip-flop, and counter 927 is reset. The first rising edge of signal CLKIN brings signal RST_QP low. On the second rising edge of signal CLKIN, signal CLK_QP provides a high value on oscillator enable signal EN to oscillator circuit 926. Thus, oscillator enable signal EN is high for one out of every five input clock cycles. Oscillator circuit 926 generates a relatively fast oscillator output signal OUT (i.e., faster than input clock signal CLKIN) whenever signal EN is high. The oscillator output signal CLK_P is used by counter 927 to measure the input clock period. Thus, in the pictured embodiment counter 927 performs the counting process only during one input clock period out of each five input clock periods. On the fourth rising edge of signal CLKIN, signal CLK_UPDT goes high. On the fifth rising edge of signal CLKIN, signal RST_QP goes high again, resetting counter 927. The cycle then repeats each five clock cycles.

Note that the number of flip-flops coupled in series in counter circuit 901 determines the frequency with which the length of the input clock period is determined. For example, in the embodiment of FIG. 9, the period is measured every five clock cycles. By adding another reset flip-flop to the chain (e.g., in front of set flip-flop 925), the period would be measured every six clock cycles, and so forth. It will be clear to one of skill in the relevant arts that this selection is a matter of design choice.

Figure 11:
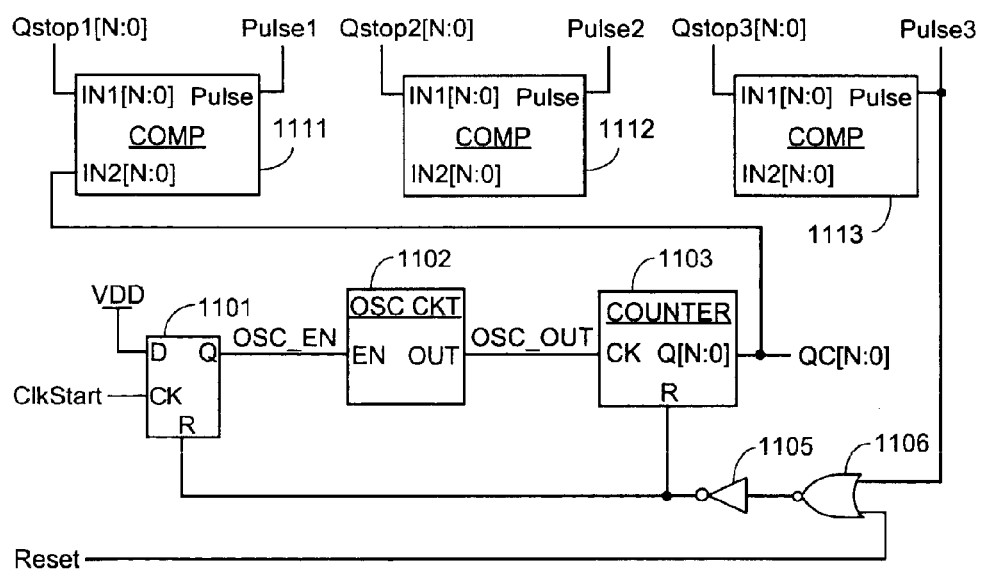
FIG. 11 is a schematic diagram of a counter that can optionally be used to implement two of the counters in the embodiment of FIG. 9.

FIG. 11 is a schematic diagram of one counter embodiment that can be used to implement counters 907–908 of FIG. 9. This embodiment can be used, for example, when counter 901 is implemented as shown in FIG. 9. The counter of FIG. 11 includes a reset flip-flop 1101, an oscillator circuit 1102, a counter 1103, three comparators 1111–1113, a NOR gate 1106, and an inverter 1105. The counter shown in FIG. 11 is similar to the counter shown in FIG. 4, and operates in a similar fashion. However, the counter shown in FIG. 4 performs only one comparison and provides only one output pulse. The counter shown in FIG. 11 performs three comparisons and provides three output pulses.

Comparator 1111 provides a high pulse on signal Pulse1 when the count value in counter 1103 matches the value Qstop1[N:0] (e.g., one-fourth of the input clock count P). Comparator 1112 provides a high pulse on signal Pulse2 when the count value in counter 1103 matches the value Qstop2[N:0] (e.g., one-half of the input clock count P). Comparator 1113 provides a high pulse on signal Pulse3 when the count value in counter 1103 matches the value Qstop3[N:0] (e.g., three-quarters of the input clock count P). A high pulse on signal Pulse3 also resets counter 1103 and flip-flop 1101 via NOR gate 1106 and inverter 1105.

Any known oscillator circuit can be used to implement oscillator circuit 1102 of FIG. 11 and oscillator circuit 926 in Counter 1 (901 in FIG. 9). Any known counter or counters can be used to implement counter 1103 of FIG. 11. For example, a well known ripple counter can be used. In some embodiments, double-edge flip-flops are used to double the count stored in the counter. In some embodiments, a first subset of the counters use double-edge flip-flops with a first oscillator frequency, while a second subset of the counters use single-edge flip-flops with a second oscillator frequency twice that of the first oscillator frequency. Any known comparator can be used to implement comparators 1111–1113 of FIG. 11. For example, the well known exclusive-NOR (XNOR) implementation can be used, wherein each pair of bits is provided to an XNOR gate, the XNOR gates are combined using NAND gates, and the NAND gates each drive a NOR gate providing the Pulse output signals in FIG. 11.

Figure 12:
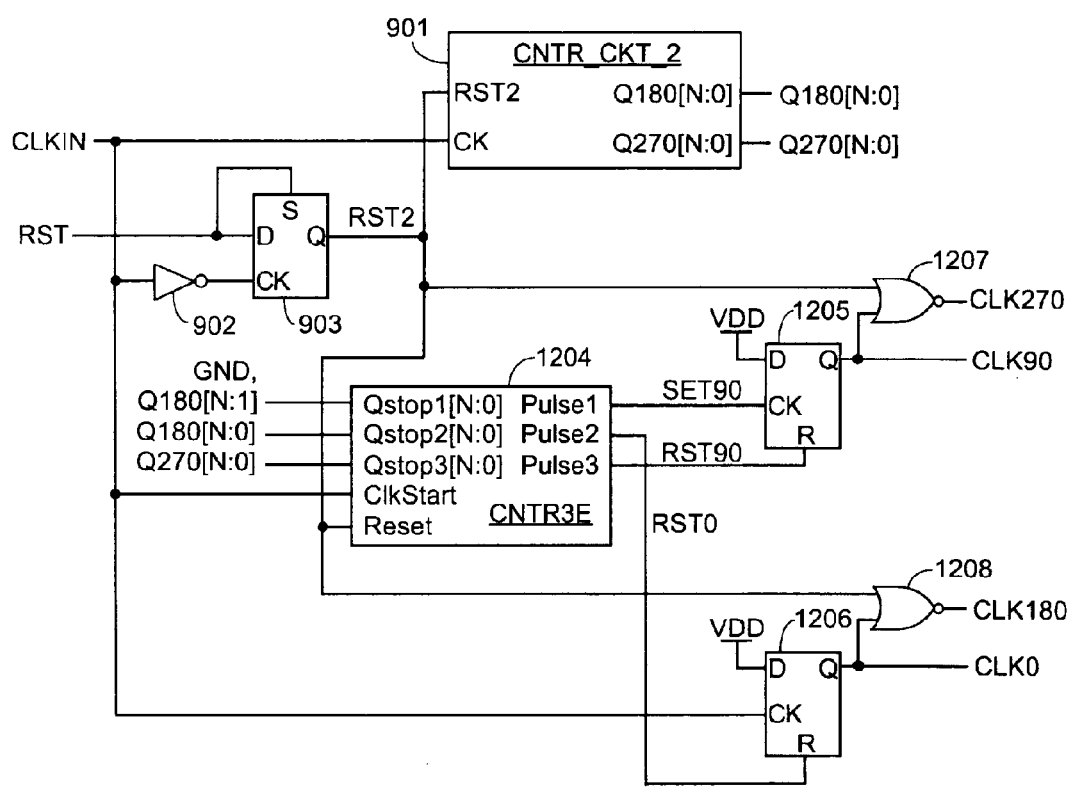
FIG. 12 is a schematic diagram of a phased clock generator circuit according to an embodiment of the invention that provides DCC and includes two counters.
Figure 13:
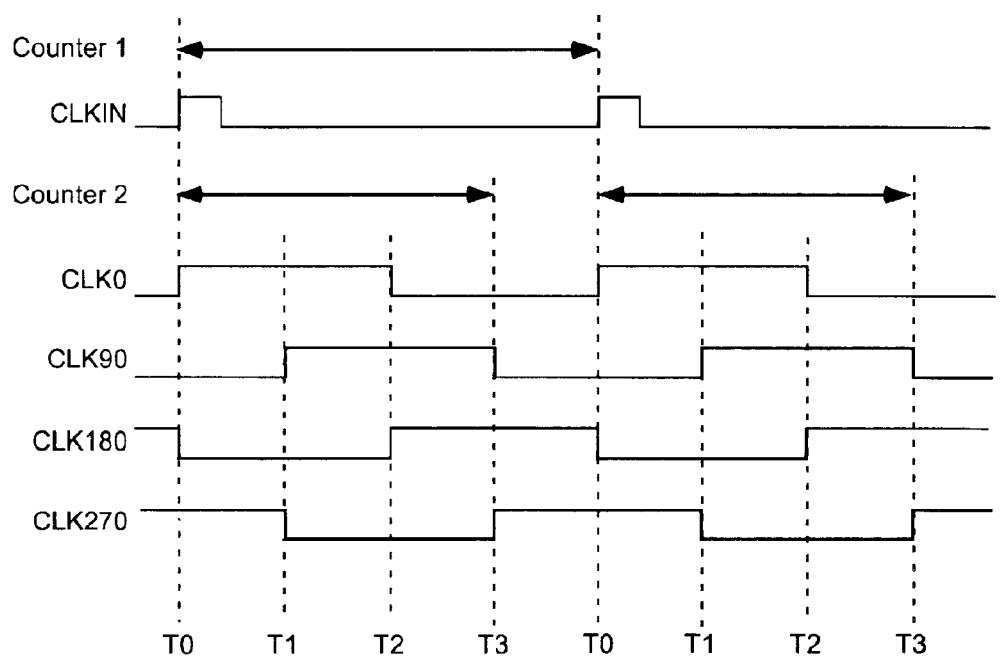
FIG. 13 is a timing diagram for the phased clock generator circuit of FIG. 12.

FIG. 12 illustrates another embodiment of the invention that includes only two counters and provides DCC. The phased clock generator circuit of FIG. 12 includes two counter circuits 901 and 1204, a reset circuit (flip-flop 903 and inverter 902), and an output clock generator (flip-flops 1205–1206 and NOR gates 1207–1208). The circuit of FIG. 12 operates as shown in FIG. 13. Thus, the combination of FIGS. 12 and 13 should be consulted in conjunction with the following explanation of the circuit of FIG. 12.

Counter 1 (901) uses a relatively faster clock signal to count a number of counts P in one period of input clock signal CLKIN. The number of counts P is divided by two and provided as registered signals Q180[N:0]. The number of counts P is also divided by four and added to Q180[N:0], with the resulting three-quarter value being provided as registered signals Q270[N:0]. N is an integer; in some embodiments, N is eight. In other embodiments, N has a value other than eight.

When signal CLKIN goes high at time T0, a high value is clocked into flip-flop 1206, and signal CLK0 goes high. The high value on signal CLK0 also drives signal CLK180 low at time T0, via NOR gate 1208. Additionally, Counter 1 begins to count a number of counts P in the period of input clock signal CLKIN. The counting process is repeated, in the pictured embodiment, during every fifth input clock cycle.

Counter 2 (1204) starts counting when input clock signal CLKIN (ClkStart) goes high, and compares the count value with three different stop values. Counter 2 can be implemented, for example, in the same way as the counter circuit shown in FIG. 11.

In a first comparator, the count value is compared with the value P/4 (Qstop1[N:0]). When the value in Counter 2 reaches P/4 (at time T1 of FIG. 13), Counter 2 (1204) provides a high output pulse on signal SET90. The high pulse on signal SET90 clocks a high value into flip-flop 1205, driving signal CLK90 high at time T1, as shown in FIG. 13. The high value on signal CLK90 also drives signal CLK270 low at time T1 via NOR gate 1207.

In a second comparator, the count value is compared with the value P/2 (Qstop2[N:0]). When the value in Counter 2 reaches P/2 (at time T2 of FIG. 13), Counter 2 (1204) provides a high output pulse on signal RST0. The high pulse on signal RST0 resets flip-flop 1206, driving signal CLK0 low at time T2, as shown in FIG. 13. Assuming that the reset signal RST2 is also low, the low value on signal CLK0 also drives signal CLK180 high at time T2 via NOR gate 1208.

In a third comparator, the count value is compared with the value 3P/4 (Qstop3[N:0]). When the value in Counter 2 reaches 3P/4 (at time T3 of FIG. 13), Counter 2 (1204) provides a high output pulse on signal RST90. The high pulse on signal RST90 resets flip-flop 1205, driving signal CLK90 low at time T3, as shown in FIG. 13. Assuming that the reset signal RST2 is also low, the low value on signal CLK90 also drives signal CLK270 high at time T3 via NOR gate 1207.

Figure 14:
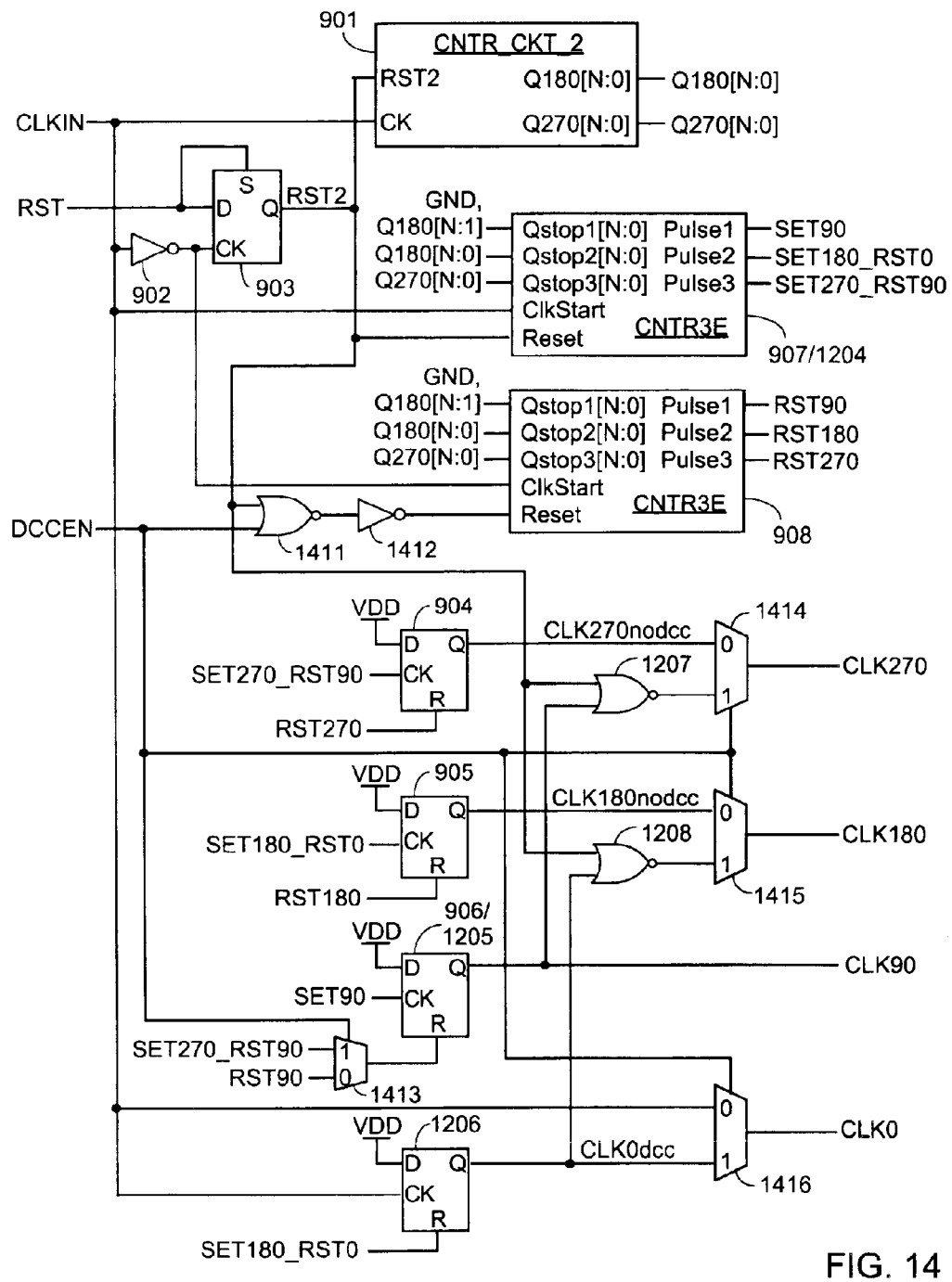
FIG. 14 is a schematic diagram of a phased clock generator circuit according to an embodiment of the invention that optionally provides DCC and includes three counters.

FIG. 14 is a schematic diagram of a phased clock generator circuit according to an embodiment of the invention that optionally provides or does not provide DCC, based on the value of a DCC enable signal DCCEN. The circuit of FIG. 14 is similar to the circuit of FIG. 9 (which does not provide DCC), with modifications that permit the optional selection of DCC as in the circuit of FIG. 12. Thus, when DCC is enabled the circuit of FIG. 14 is similar to that of FIG. 12. Only the differences from FIGS. 9 and 12 are described.

As in the embodiment of FIG. 9, Counter 3 (908) is reset when signal RST2 is high. However, Counter 3 is also reset whenever signal DCCEN is high. Therefore, when signal DCCEN is high, Counter 3 is effectively removed from the circuit, as in the embodiment of FIG. 12.

Signal CLK0 is provided by multiplexer 1416, which is controlled by signal DCCEN. When signal DCCEN is low (i.e., DCC is disabled), output signal CLK0 is the same as signal CLKIN, as in FIG. 9. When signal DCCEN is high (i.e., DCC is enabled), output signal CLK0 is the output of flip-flop 1206 (CLK0dcc), as in FIG. 12.

Signal CLK90 is provided by flip-flop 906/1205, which is reset by a signal from multiplexer 1413. When signal DCCEN is low, the reset signal for flip-flop 906/1205 is RST90, or Pulse1 from Counter 3 (908), as in FIG. 9. When signal DCCEN is high, the reset signal for flip-flop 906/1205 is SET270_RST90, or Pulse3 from Counter 1, as in FIG. 12.

Signal CLK180 is provided by multiplexer 1415, which is controlled by signal DCCEN. When signal DCCEN is low, output signal CLK180 is the output of flip-flop 905 (CLK180nodcc), as in FIG. 9. When signal DCCEN is high, output signal CLK180 is provided by NOR gate 1208, as in FIG. 12.

Signal CLK270 is provided by multiplexer 1414, which is controlled by signal DCCEN. When signal DCCEN is low, output signal CLK270 is the output of flip-flop 904 (CLK270nodcc), as in FIG. 9. When signal DCCEN is high, output signal CLK270 is provided by NOR gate 1207, as in FIG. 12.

Figure 15:
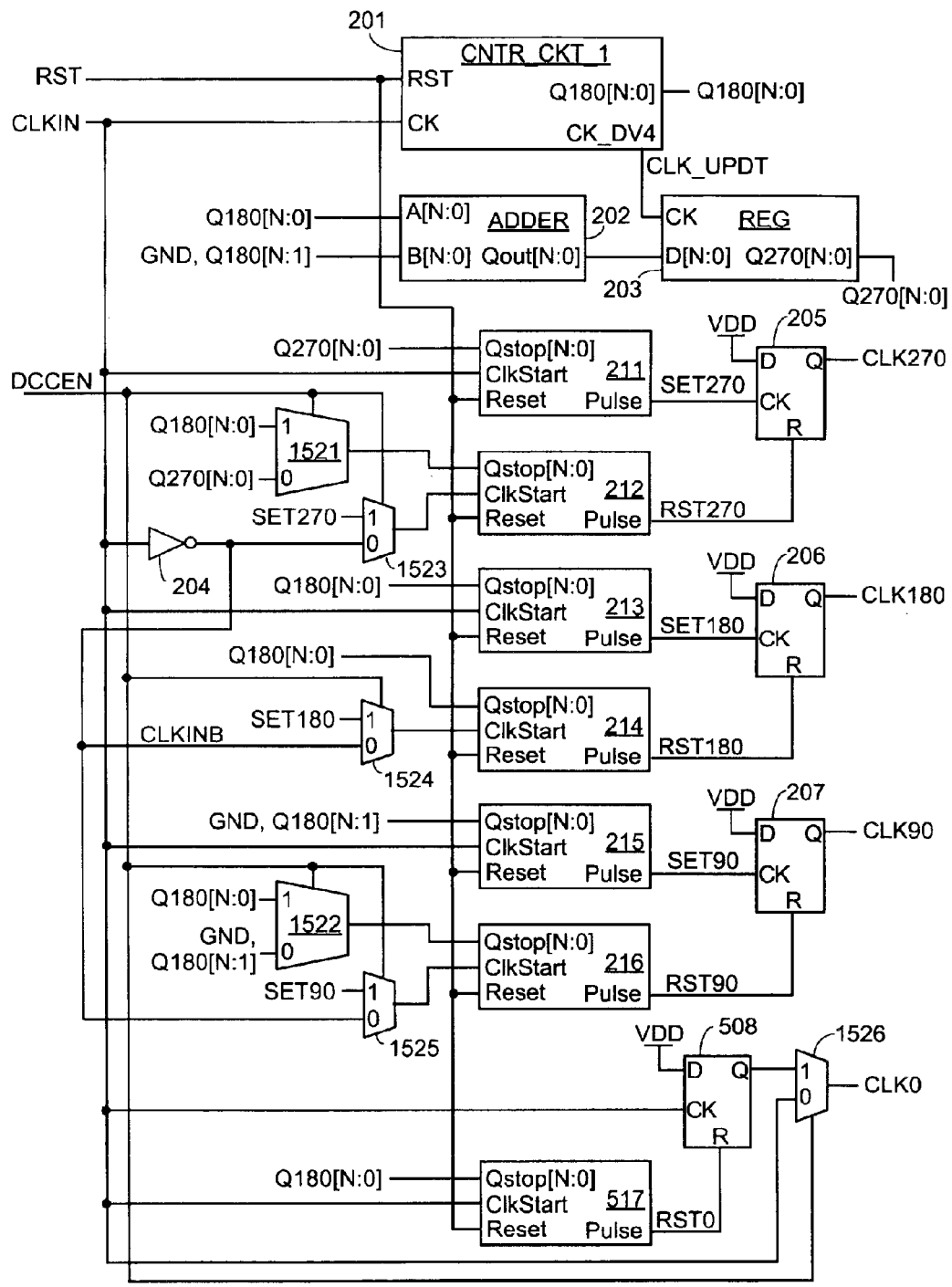
FIG. 15 is a schematic diagram of a first phased clock generator circuit according to an embodiment of the invention that optionally provides DCC and includes eight counters.

FIG. 15 is a schematic diagram of another phased clock generator circuit according to an embodiment of the invention that optionally provides or does not provide DCC, based on the value of a DCC enable signal DCCEN. The circuit of FIG. 15 is similar to the circuit of FIG. 2 (which does not provide DCC), with modifications that permit the optional selection of DCC as in FIG. 5. Thus, when DCC is enabled the circuit of FIG. 15 is similar to that of FIG. 5. Only the differences from FIGS. 2 and 5 are described.

Signal CLK0 is provided by multiplexer 1526, which is controlled by signal DCCEN. When signal DCCEN is low (i.e., DCC is disabled), output signal CLK0 is the same as signal CLKIN, as in FIG. 2. When signal DCCEN is high (i.e., DCC is enabled), output signal CLK0 is the output of flip-flop 508, as in FIG. 5.

The start value ClkStart for Counter 3 (216) is provided by a multiplexer 1525, which is controlled by signal DCCEN. When signal DCCEN is low, the start value is signal CLKINB, or the inverse of signal CLKIN, as in FIG. 2. When signal DCCEN is high, the start value is signal SET90, as in FIG. 5.

The stop value Qstop[N:0] for Counter 3 (216) is provided by a multiplexer 1522, which is controlled by signal DCCEN. When signal DCCEN is low, the stop value is GND, Q180[N:1], or P/4, as in FIG. 2. When signal DCCEN is high, the stop value is Q180[N:0], or P/2, as in FIG. 5.

The start value ClkStart for Counter 5 (214) is provided by a multiplexer 1524, which is controlled by signal DCCEN. When signal DCCEN is low, the start value is signal CLKINB, or the inverse of signal CLKIN, as in FIG. 2. When signal DCCEN is high, the start value is signal SET180, as in FIG. 5.

The start value ClkStart for Counter 7 (212) is provided by a multiplexer 1523, which is controlled by signal DCCEN. When signal DCCEN is low, the start value is signal CLKINB, or the inverse of signal CLKIN, as in FIG. 2. When signal DCCEN is high, the start value is signal SET270, as in FIG. 5.

The stop value Qstop[N:0] for Counter 7 (212) is provided by a multiplexer 1521, which is controlled by signal DCCEN. When signal DCCEN is low, the stop value is Q270[N:0], or 3P/4, as in FIG. 2. When signal DCCEN is high, the stop value is Q180[N:0], or P/2, as in FIG. 5.

Figure 16:
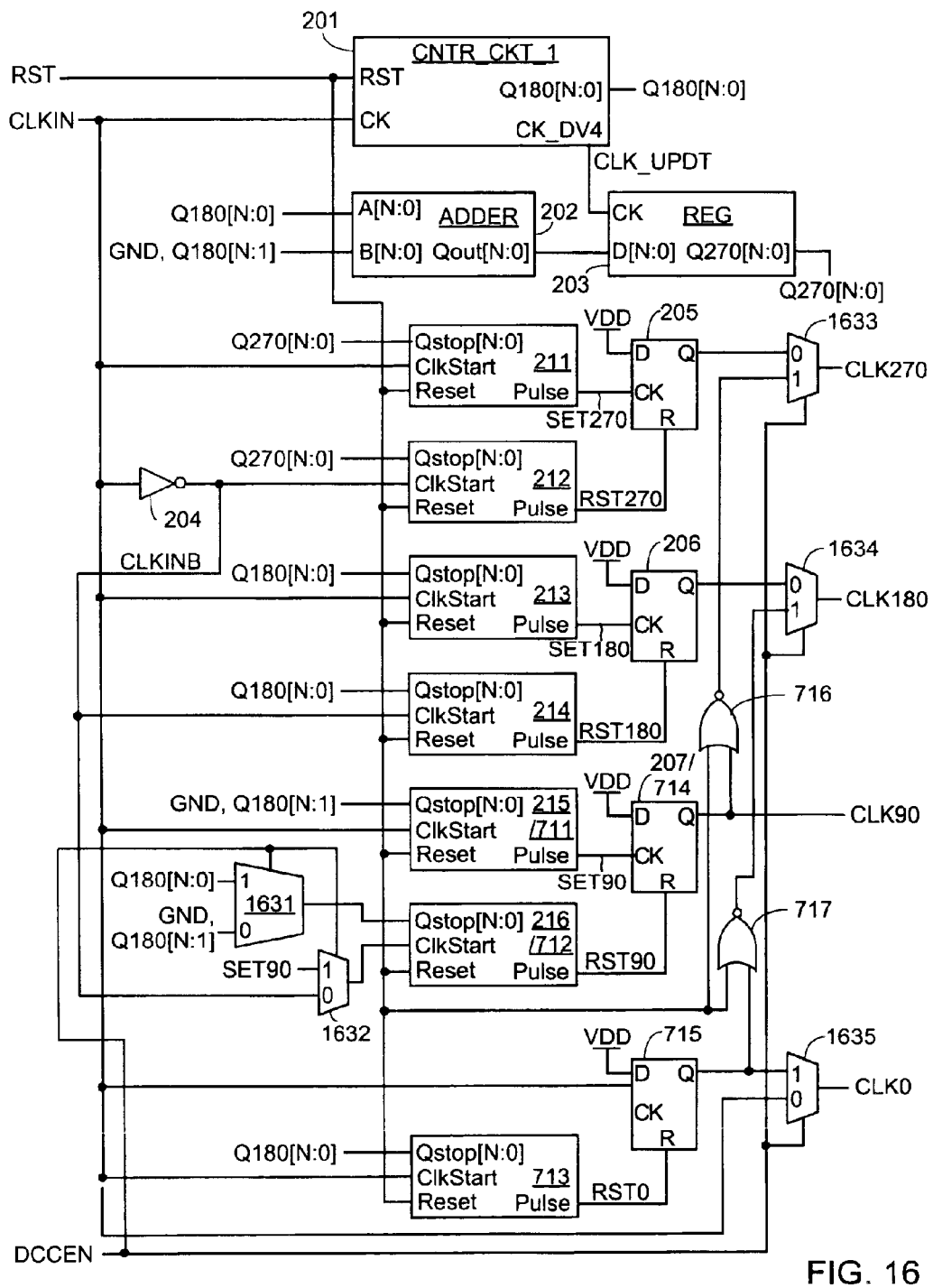
FIG. 16 is a schematic diagram of a second phased clock generator circuit according to an embodiment of the invention that optionally provides DCC and includes eight counters.

FIG. 16 is a schematic diagram of another phased clock generator circuit according to an embodiment of the invention that optionally provides or does not provide DCC, based on the value of a DCC enable signal DCCEN. The circuit of FIG. 16 provides another embodiment that is similar to the circuit of FIG. 2 (which does not provide DCC), with modifications that permit the optional selection of DCC as in the circuit of FIG. 7. Thus, when DCC is enabled the circuit of FIG. 16 is similar to that of FIG. 7. Only the differences from FIGS. 2 and 7 are described.

The start value ClkStart for Counter 3 (216/712) is provided by a multiplexer 1632, which is controlled by signal DCCEN. When signal DCCEN is low, the start value is signal CLKINB, or the inverse of signal CLKIN, as in FIG. 2. When signal DCCEN is high, the start value is signal SET90, as in FIG. 7.

The stop value Qstop[N:0] for Counter 3 (216/712) is provided by a multiplexer 1631, which is controlled by signal DCCEN. When signal DCCEN is low, the stop value is GND, Q180[N:1], or P/4, as in FIG. 2. When signal DCCEN is high, the stop value is Q180[N:0], or P/2, as in FIG. 7.

Signal CLK0 is provided by multiplexer 1635, which is controlled by signal DCCEN. When signal DCCEN is low (i.e., DCC is disabled), output signal CLK0 is the same as signal CLKIN, as in FIG. 2 when signal DCCEN is high (i.e., DCC is enabled), output signal CLK0 is the output of flip-flop 715, as in FIG. 7.

Signal CLK180 is provided by multiplexer 1634, which is controlled by signal DCCEN. When signal DCCEN is low, output signal CLK180 is the output of flip-flop 206, as in FIG. 2. When signal DCCEN is high, output signal CLK180 is provided by NOR gate 717, as in FIG. 7.

Signal CLK270 is provided by multiplexer 1633, which is controlled by signal DCCEN. When signal DCCEN is low, output signal CLK270 is the output of flip-flop 205, as in FIG. 2. When signal DCCEN is high, output signal CLK270 is provided by NOR gate 716, as in FIG. 7.

Figure 17:
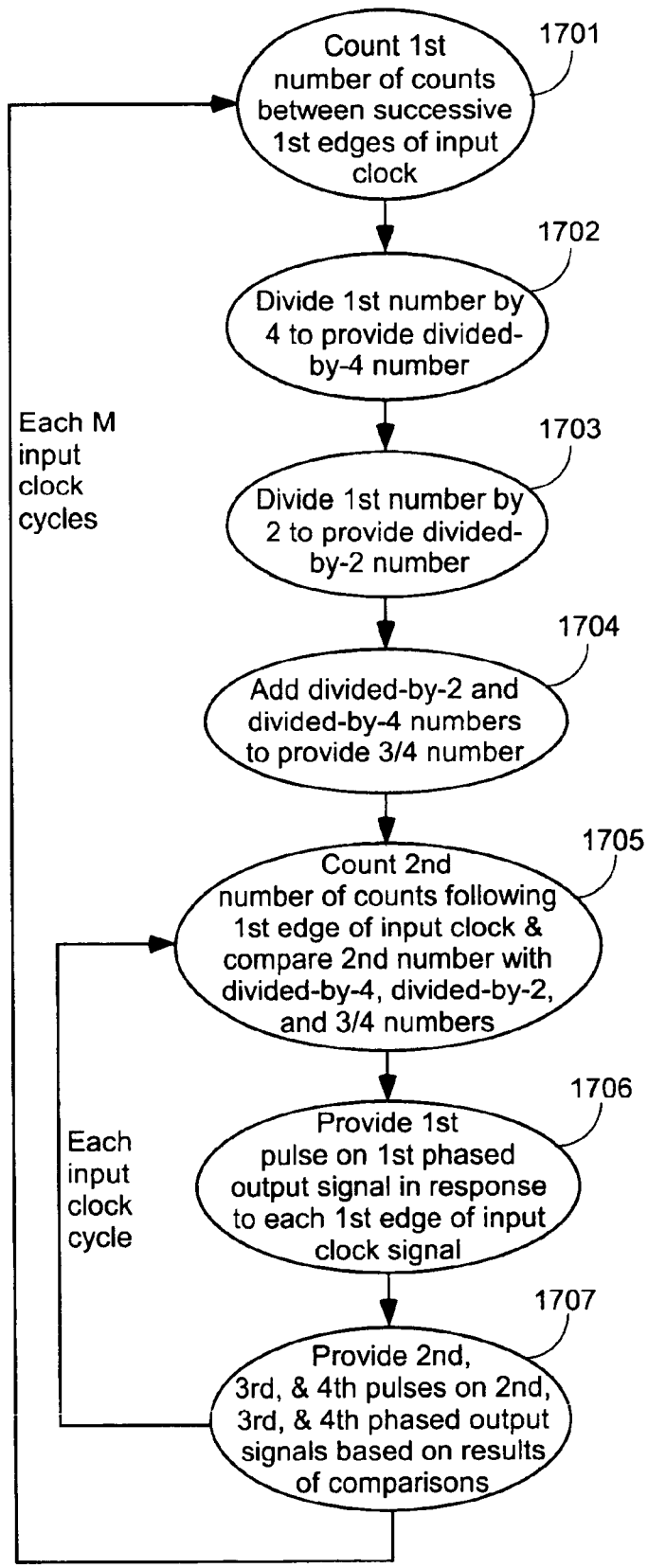
FIG. 17 illustrates the steps of a novel method of providing from an input clock signal a plurality of phased output clock signals, according to another embodiment of the invention.

FIG. 17 illustrates the steps of a novel method of providing from an input clock signal a plurality of phased output clock signals, according to another embodiment of the invention. The steps of FIG. 17 can be performed, for example, using the circuits illustrated in FIGS. 2–16. In some embodiments, the steps of FIG. 17 are performed by a circuit implemented in a programmable logic device (PLD), for example in a field programmable gate array (FPGA).

In step 1701, a first number of counts between successive first edges of an input clock signal is counted. For example, in the described embodiments, Counter 1 (201, 901) counts a number P of oscillator clock cycles within a single period of input clock signal CLKIN. In some embodiments, the first edges are rising edges.

In step 1702, the first number is divided by four to provide a divided-by-four number. In some embodiments, the first number is stored, then is divided as it is passed to another circuit. In some embodiments, the first number is divided prior to being stored in a register. In some embodiments, the first number is divided by two, stored, then divided by two again as it is passed to another circuit.

In step 1703, the first number is divided by two to provide a divided-by-two number. In some embodiments, the first number is stored, then is divided as it is passed to another circuit. In some embodiments, the first number is divided prior to being stored in a register. Steps 1702 and 1703 can occur in any order, or simultaneously.

In step 1704, the divided-by-two and divided-by-four numbers are added to provide a three-quarter number.

In step 1705, a second number of counts following each first edge of the input clock are counted, and the second number is compared with the divided-by-four number, the divided-by-two number, and the three-quarter number.

In step 1706, a first pulse is provided on a first phased output clock signal in response to each first edge of the input clock signal.

In step 1707, second, third, and fourth pulses are provided on second, third, and fourth phased output clock signals. The second pulse is provided based on the results of comparing the second number with the divided-by-four number. The third pulse is provided based on the results of comparing the second number with the divided-by-two number. The fourth pulse is provided based on the results of comparing the second number with the three-quarter number.

In some embodiments, steps 1701–1704 are repeated every M periods of the input clock signal, where M is an integer. In some embodiments, M is four. In some embodiments, M is five. In some embodiments, M has a value other than four or five.

In some embodiments, the output clock signal has a 50 percent duty cycle. In other embodiments, each phased output clock signal has a pulse width the same as a pulse width of the input clock signal. In other embodiments, each phased output signal has a pulse width determined in some other fashion.

Those having skill in the relevant arts of the invention will now perceive various modifications and additions that can be made as a result of the disclosure herein. For example, the above text describes the circuits and methods of the invention in the context of ICs such as programmable logic devices (PLDS). However, the circuits of the invention can also be implemented in other electronic systems, for example, in non-programmable integrated circuits, or in printed circuit boards including discrete devices.

As another example, the concepts of the invention can clearly be extended to provide phased output clock generators providing more or fewer than four phased output signals, and/or output clock signals having phases other than 0, 90, 180, or 270 degrees. As will be clear to those of skill in the relevant arts, by appropriately selecting the number and values of start and stop values provided to counter circuits, set and reset pulses can be generated as desired to provide phased output clock signals having edges in various desired locations.

Further, inverters, NOR gates, NAND gates, XNOR gates, flip-flops, counters, counter circuits, oscillators, registers, output clock generators, reset circuits, adders, multiplexers, comparators, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A system comprising a phased clock generator circuit, the phased clock generator circuit comprising:
    an input clock terminal;
    a plurality of output clock terminals;
    a first counter circuit having a clock terminal coupled to the input clock terminal and further having N+1 output terminals, where N is an integer;
    a divide-by-two register having a plurality of data input terminals coupled to N most significant output terminals of the first counter circuit, a clock terminal coupled to receive a clock update signal from the first counter circuit, and a plurality of output terminals;
    an adder circuit having a first plurality of data input terminals coupled to the N most significant output terminals of the divide-by-two register, a second plurality of data input terminals coupled to N−1 most significant output terminals of the divide-by-two register, and a plurality of output terminals;
    a three-quarter register having a plurality of input terminals coupled to the output terminals of the adder circuit, and further having a plurality of output terminals;
    a second counter circuit having a clock start terminal coupled to the input clock terminal, a plurality of clock stop terminals coupled to at least a subset of the output terminals of the divide-by-two register and the three-quarter register, and a plurality of output terminals; and
    an output clock generator having a plurality of input terminals coupled to the output terminals of the second counter circuit, and further having a plurality of output terminals coupled to the output clock terminals.

2. The system of claim 1, wherein the first counter circuit comprises:
    a first oscillator circuit having an input terminal coupled to the input clock terminal and further having an output terminal; and
    a first counter having an input terminal coupled to the output terminal of the first oscillator circuit and further having a plurality of output terminals coupled to the output terminals of the first counter circuit.

3. The system of claim 2, wherein the second counter circuit comprises:
    a second oscillator circuit having an input terminal coupled to the input clock terminal and further having an output terminal, the second oscillator circuit being implemented to oscillate with the same frequency as the first oscillator circuit;
    a second counter having an input terminal coupled to the output terminal of the second oscillator circuit and further having a plurality of output terminals;
    a one-quarter comparator having a first set of input terminals coupled to a subset of the output terminals of the divide-by-two register, a second set of input terminals coupled to the output terminals of the second counter, and an output terminal coupled to a first one of the input terminals of the output clock generator;
    a one-half comparator having a first set of input terminals coupled to the output terminals of the divide-by-two register, a second set of input terminals coupled to the output terminals of the second counter, and an output terminal coupled to a second one of the input terminals of the output clock generator; and
    a three-quarter comparator having a first set of input terminals coupled to the output terminals of the three-quarter register, a second set of input terminals coupled to the output terminals of the second counter, and an output terminal coupled to a third one of the input terminals of the output clock generator.

4. The system of claim 1, wherein the phased clock generator circuit further comprises a reset input terminal coupled to reset input terminals of the first counter circuit, the divide-by-two register, the three-quarter register, and the second counter circuit.

5. The system of claim 1, wherein the phased clock generator circuit further comprises:
    a reset input terminal; and
    a flip-flop having a data input terminal coupled to the reset input terminal, a set terminal coupled to the data input terminal, a clock terminal coupled to the input clock terminal of the phased clock generator circuit, and an output terminal coupled to reset input terminals of the first counter circuit, the divide-by-two register, the three-quarter register, and the second counter circuit.

6. The system of claim 1, wherein the first counter circuit comprises means for resetting itself after each M input clock periods, wherein M is an integer.

7. The system of claim 6, wherein M is one of four and five.

8. The system of claim 1, wherein the system comprises a programmable logic device (PLD), and the phased clock generator circuit is implemented using programmable logic of the PLD.

9. The system of claim 8, wherein the PLD is a field programmable gate array (FPGA).

10. The system of claim 8, wherein the PLD is a complex programmable logic device (CPLD).

11. The system of claim 1, wherein the output clock generator comprises:
    a first flip-flop having a data input terminal coupled to power high VDD, a clock terminal coupled to a first output terminal of the second counter circuit, a reset terminal coupled to a second output terminal of the second counter circuit, and an output terminal coupled to a first one of the output clock terminals; and
    a second flip-flop having a data input terminal coupled to the power high VDD, a clock terminal coupled to a third output terminal of the second counter circuit, a reset terminal coupled to a fourth output terminal of the second counter circuit, and an output terminal coupled to a second one of the output clock terminals.

12. The system of claim 11, wherein the output clock generator further comprises:
a third flip-flop having a data input terminal coupled to the power high VDD, a clock terminal coupled to a fifth output terminal of the second counter circuit, a reset terminal coupled to a sixth output terminal of the second counter circuit, and an output terminal coupled to a third one of the output clock terminals.

13. The system of claim 1, wherein the output clock generator comprises:
a first flip-flop having a data input terminal coupled to power high VDD, a clock terminal coupled to a first output terminal of the second counter circuit, a reset terminal coupled to a second output terminal of the second counter circuit, and an output terminal coupled to a first one of the output clock terminals; and
a second flip-flop having a data input terminal coupled to the power high VDD, a clock terminal coupled to the input clock terminal, a reset terminal coupled to a third output terminal of the second counter circuit, and an output terminal coupled to a second one of the output clock terminals.

14. A system providing from an input clock signal a plurality of phased output clock signals, the system comprising:
first counter means for counting a first number of counts between successive first edges of the input clock signal;
means for dividing the first number by four to provide a divided-by-four number;
means for dividing the first number by two to provide a divided-by-two number;
adder means for adding the divided-by-four number and the divided-by-two number to provide a three-quarter number;
second counter means for counting a second number of counts following each first edge of the input clock signal and comparing the second number with the divided-by-four number, the divided-by-two number, and the three-quarter number;
first pulse generator means for providing a first pulse on a first phased output clock signal in response to each first edge of the input clock signal;
second pulse generator means for providing a second pulse on a second phased output clock signal based on results of comparing the second number with the divided-by-four number;
third pulse generator means for providing a third pulse on a third phased output clock signal based on results of comparing the second number with the divided-by-two number; and
fourth pulse generator means for providing a fourth pulse on a fourth phased output clock signal based on results of comparing the second number with the three-quarter number.

15. The system of claim 14, further comprising reset means for resetting the first counter means, the second counter means, the first pulse generator means, the second pulse generator means, the third pulse generator means, and the fourth pulse generator means.

16. The system of claim 14, wherein the first counter means comprises means for resetting itself after each M input clock periods, wherein M is an integer.

17. The system of claim 16, wherein M is one of four and five.

18. The system of claim 14, wherein each of the first, second, third, and fourth phased output clock signals has a pulse width the same as a pulse width of the input clock signal.

19. The system of claim 14, wherein each of the first, second, third, and fourth phased output clock signals has a 50 percent duty cycle.

20. The system of claim 14, further comprising means for enabling duty cycle correction for the first, second, third, and fourth phased output clock signals.

21. A method of providing from an input clock signal a plurality of phased output clock signals, the method comprising:
counting a first number of counts between successive first edges of the input clock signal;
dividing the first number by four to provide a divided-by-four number;
dividing the first number by two to provide a divided-by-two number;
adding the divided-by-four number and the divided-by-two number to provide a three-quarter number;
counting a second number of counts following each first edge of the input clock signal and comparing the second number with the divided-by-tour number, the divided-by-two number, and the three-quarter number;
providing a first pulse on a first phased output clock signal in response to each first edge of the input clock signal;
providing a second pulse on a second phased output clock signal based on results of comparing the second number with the divided-by-four number;
providing a third pulse on a third phased output clock signal based on results of comparing the second number with the divided-by-two number; and
providing a fourth pulse on a fourth phased output clock signal based on results of comparing the second number with the three-quarter number.

22. The method of claim 21, wherein the counting the first number of counts is repeated every M periods of the input clock signal, wherein M is an integer.

23. The method of claim 22, wherein M is one of four and five.

24. The method of claim 21, wherein the steps of the method are performed by a circuit implemented in a programmable logic device (PLD).

25. The method of claim 24, wherein the PLD is a field programmable gate array (FPGA).

26. The method of claim 24, wherein the PLD is a complex programmable logic device (CPLD).

27. The method of claim 21, wherein the first number has 2 to the power of 8 possible values.

28. The method of claim 21, wherein the first edges are rising edges.

29. The method of claim 21, wherein each of the first, second, third, and fourth phased output clock signals has a pulse width the same as a pulse width of the input clock signal.

30. The method of claim 21, wherein each of the first, second, third, and fourth phased output clock signals has a 50 percent duty cycle.

31. The method of claim 21, further comprising enabling duty cycle correction for the first, second, third, and fourth phased output clock signals.

* * * * *